United States Patent
Sakata et al.

(10) Patent No.: US 9,673,217 B1
(45) Date of Patent: Jun. 6, 2017

(54) SEMICONDUCTOR DEVICE AND METHOD FOR MANUFACTURING SAME

(71) Applicant: KABUSHIKI KAISHA TOSHIBA, Tokyo (JP)

(72) Inventors: Atsuko Sakata, Mie (JP); Yohei Sato, Mie (JP); Yasuhito Yoshimizu, Mie (JP); Satoshi Wakatsuki, Mie (JP); Takeshi Ishizaki, Aichi (JP); Masayuki Kitamura, Mie (JP); Daisuke Ikeno, Mie (JP); Tomotaka Ariga, Mie (JP); Junichi Wada, Mie (JP); Hiroshi Tomita, Aichi (JP); Hisashi Okuchi, Mie (JP); Ryohei Kitao, Mie (JP); Toshiyuki Sasaki, Mie (JP); Kazuhito Furumoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/258,675

(22) Filed: Sep. 7, 2016

Related U.S. Application Data

(60) Provisional application No. 62/299,731, filed on Feb. 25, 2016.

(51) Int. Cl.
*H01L 27/115* (2017.01)
*H01L 27/11582* (2017.01)
*H01L 27/11568* (2017.01)

(52) U.S. Cl.
CPC .. *H01L 27/11582* (2013.01); *H01L 27/11568* (2013.01)

(58) Field of Classification Search
CPC .................. H01L 27/11582; H01L 27/11568
See application file for complete search history.

(56) References Cited

U.S. PATENT DOCUMENTS

| | | | |
|---|---|---|---|
| 7,847,334 B2 | 12/2010 | Katsumata et al. |
| 8,148,763 B2 | 4/2012 | Kim et al. |
| 8,338,876 B2 | 12/2012 | Kito et al. |
| 8,569,825 B2 | 10/2013 | Iinuma |
| 8,723,247 B2 | 5/2014 | Komori et al. |
| 2011/0180866 A1 | 7/2011 | Matsuda et al. |
| 2011/0287612 A1 | 11/2011 | Lee et al. |
| 2013/0221423 A1 | 8/2013 | Kawasaki et al. |
| 2013/0252391 A1 | 9/2013 | Lee et al. |
| 2014/0061752 A1 | 3/2014 | Omoto et al. |
| 2015/0060993 A1 | 3/2015 | Lee et al. |

FOREIGN PATENT DOCUMENTS

| | | |
|---|---|---|
| JP | 2003-243368 | 8/2003 |
| JP | 2013-8794 | 1/2013 |

*Primary Examiner* — Long Pham
(74) *Attorney, Agent, or Firm* — Finnegan, Henderson, Farabow, Garrett & Dunner, L.L.P.

(57) ABSTRACT

According to one embodiment, a semiconductor device includes a stacked body, a semiconductor body, and a stacked film. The stacked body includes a plurality of tungsten layers and a plurality of alloy layers of tungsten and molybdenum. At least portions of the tungsten layers are stacked with an air gap interposed. The alloy layers are provided on surfaces of the tungsten layers opposing the air gap. The semiconductor body extends in a stacking direction through the stacked body. The stacked film is provided between the semiconductor body and the tungsten layers. The stacked film includes a charge storage portion.

6 Claims, 27 Drawing Sheets

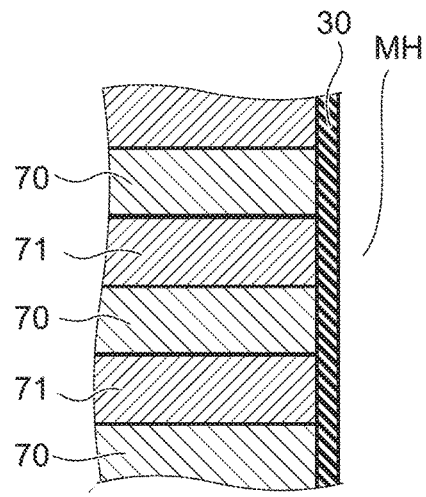
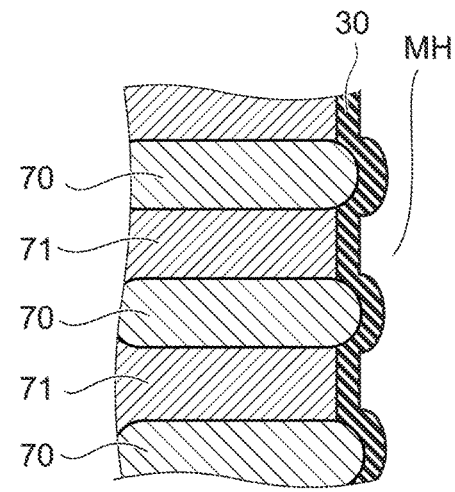
FIG. 27A  FIG. 27B
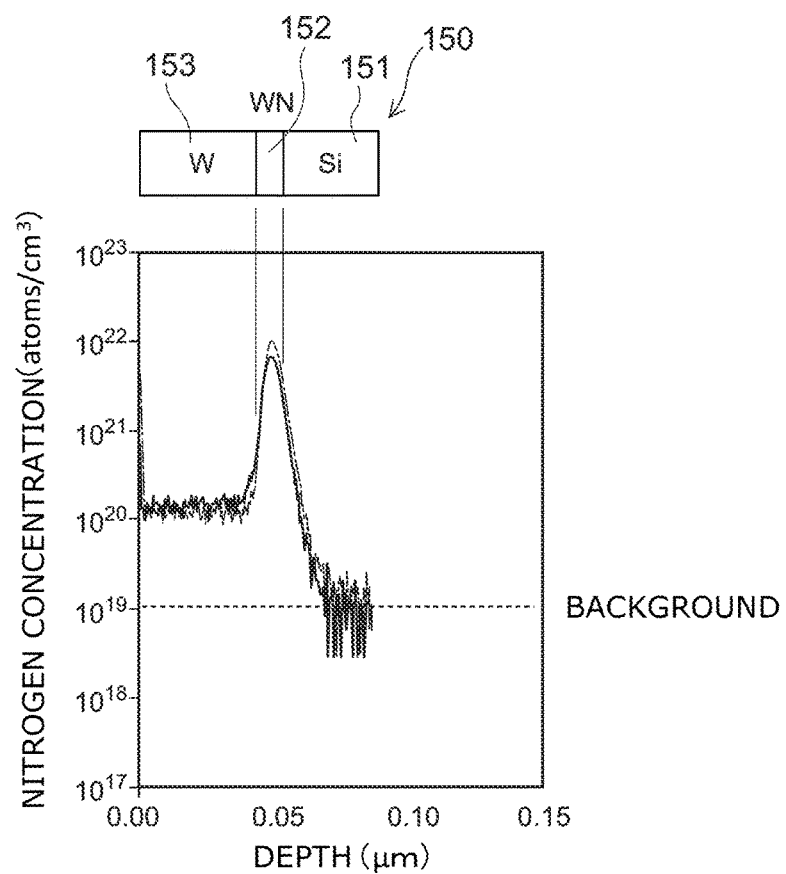
FIG. 28

SEMICONDUCTOR DEVICE AND METHOD FOR MANUFACTURING SAME

CROSS-REFERENCE TO RELATED APPLICATION

This application is based upon and claims the benefit of priority from U.S. Provisional Patent Application 62/299,731, filed on Feb. 25, 2016; the entire contents of which are incorporated herein by reference.

FIELD

Embodiments described herein relate generally to a semiconductor device and a method for manufacturing the same.

BACKGROUND

For a three-dimensional memory device including a plurality of electrode layers stacked on a substrate, a structure has been proposed in which metal layers are formed as the electrode layers, and an air gap is further made between the metal layers adjacent to each other above and below. The air gap is made by removing sacrificial layers after the metal layers and the sacrificial layers are stacked alternately. There are cases where it is desirable to appropriately combine the material of the metal layer and the material of the sacrificial layer for the processes and device characteristics.

BRIEF DESCRIPTION OF THE DRAWINGS

FIGS. 18 to 27B are schematic views showing a method for manufacturing the semiconductor device of the second embodiment; and FIG. 28 is a graph showing a nitrogen concentration distribution of a sample of a test example.

DETAILED DESCRIPTION

According to one embodiment, a semiconductor device includes a stacked body, a semiconductor body, and a stacked film. The stacked body includes a plurality of tungsten layers and a plurality of alloy layers of tungsten and molybdenum. At least portions of the tungsten layers are stacked with an air gap interposed. The alloy layers are provided on surfaces of the tungsten layers opposing the air gap. The semiconductor body extends in a stacking direction through the stacked body. The stacked film is provided between the semiconductor body and the tungsten layers. The stacked film includes a charge storage portion.

For example, a semiconductor memory device that includes a memory cell array having a three-dimensional structure is described as a semiconductor device in the embodiments.

Figure 1:
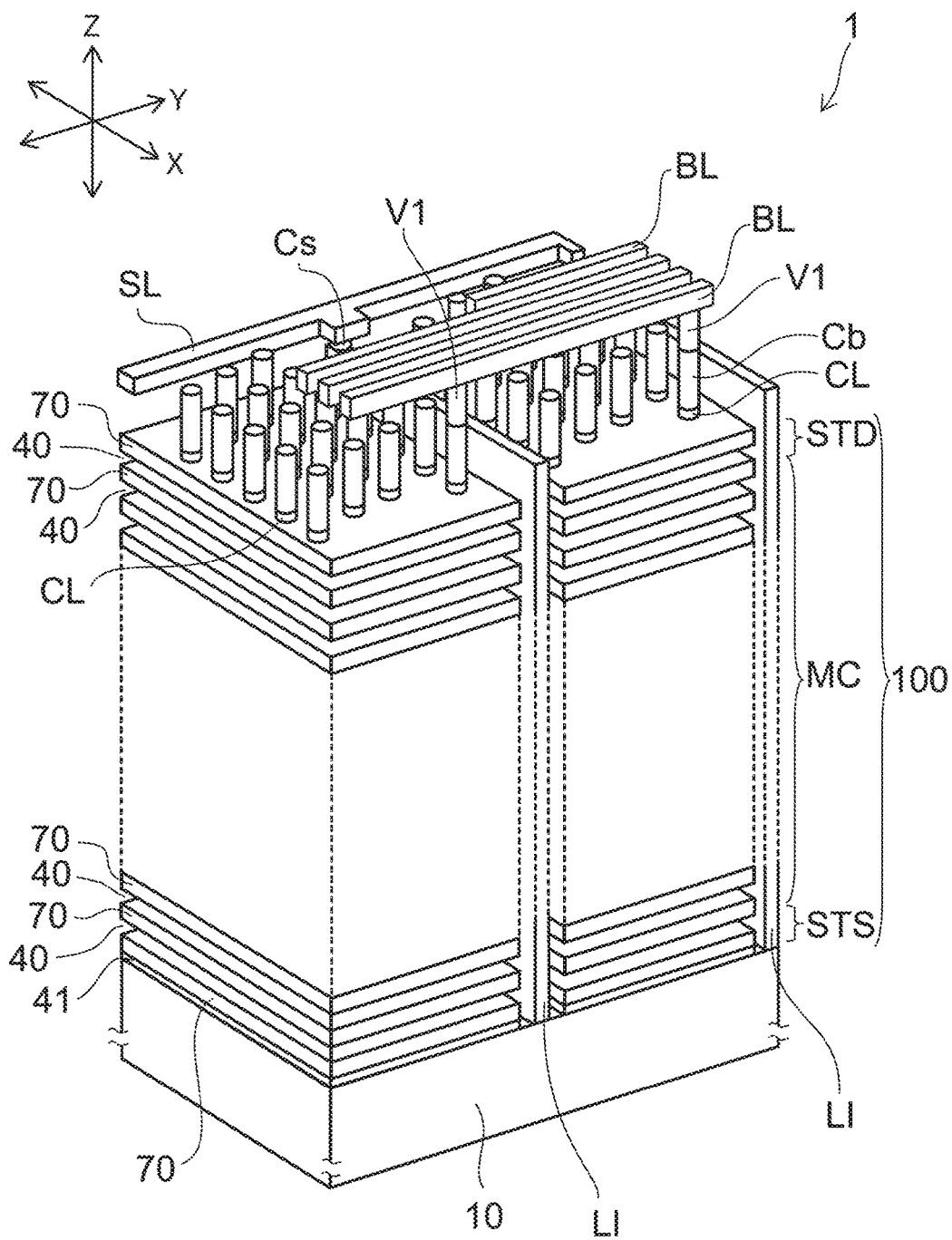
FIG. 1 is a schematic perspective view of a semiconductor device of a first embodiment.

FIG. 1 is a schematic perspective view of the memory cell array 1 of the semiconductor device of a first embodiment.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction).

The memory cell array 1 includes the substrate 10, a stacked body 100 stacked on the major surface of the substrate 10, a plurality of columnar portions CL, a plurality of interconnect portions LI, and upper layer interconnects provided above the stacked body 100. For example, bit lines BL and a source line SL are shown as the upper layer interconnects in FIG. 1.

The columnar portions CL are formed in circular columnar or elliptical columnar configurations extending in the stacking direction (the Z-direction) through the stacked body 100. The interconnect portions LI spread in the X-direction and the stacking direction of the stacked body 100 (the Z-direction), and divide the stacked body 100 into a plurality of blocks (or fingers) in the Y-direction.

For example, the columnar portions CL have a staggered arrangement. Or, the columnar portions CL may have a square lattice arrangement along the X-direction and the Y-direction.

The bit lines BL are provided above the stacked body 100. The bit lines BL are, for example, metal films extending in the Y-direction. The bit lines BL are separated from each other in the X-direction.

The upper ends of semiconductor bodies of the columnar portions CL described below are connected to the bit lines BL via contacts Cb and V1. The plurality of columnar portions CL are connected to one common bit line BL. The columnar portions CL that are connected to the common bit line BL include one columnar portion CL selected from each block separated in the Y-direction by the interconnect portions LI.

Figure 2:
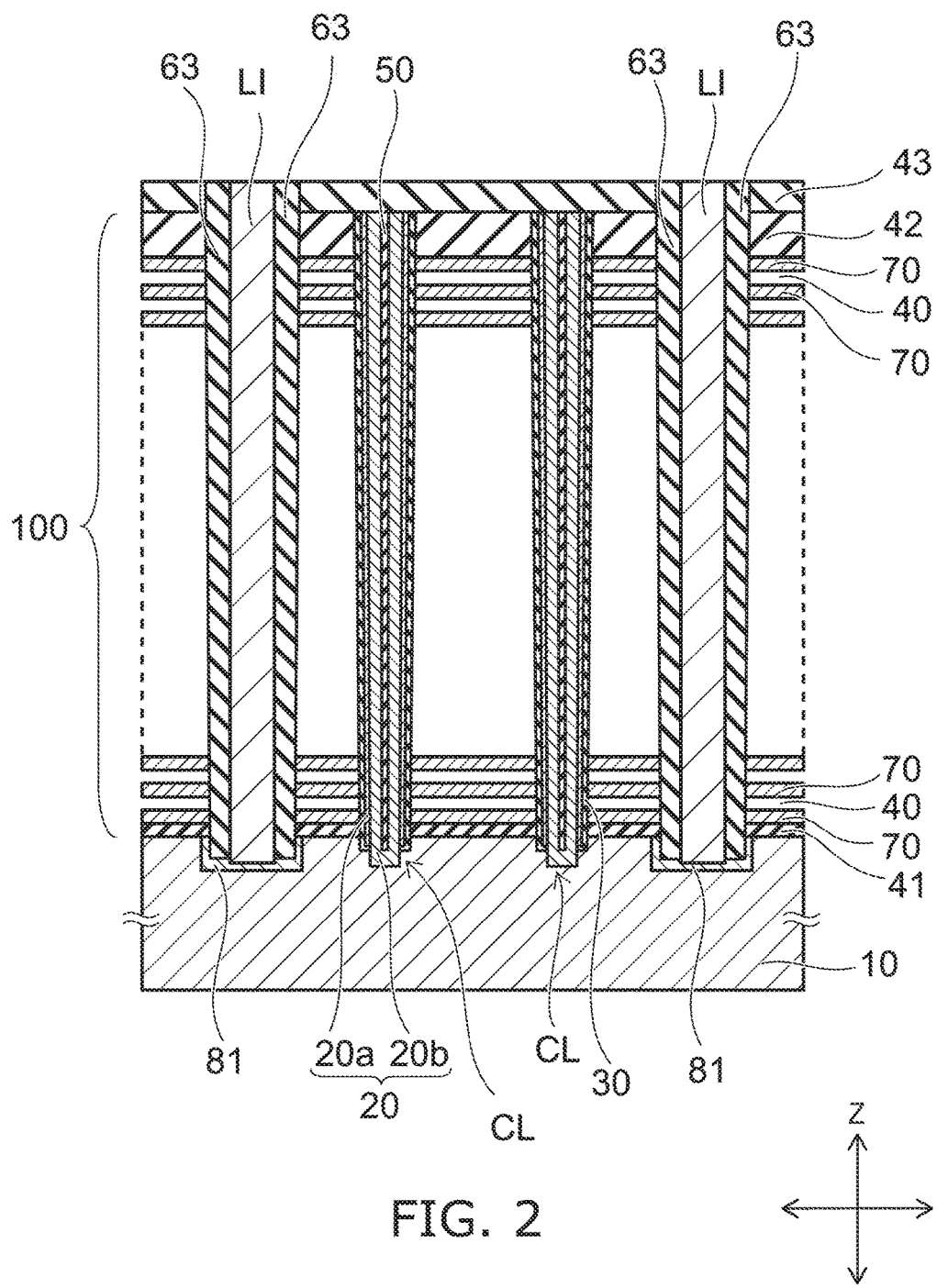
FIG. 2 is a schematic cross-sectional view of the semiconductor device of the first embodiment.

FIG. 2 is a schematic cross-sectional view of the memory cell array 1. The Y-direction and the Z-direction shown in FIG. 2 correspond respectively to the Y-direction and the Z-direction shown in FIG. 1.

The stacked body 100 includes a plurality of tungsten layers 70 stacked on the major surface of the substrate 10. The tungsten layers 70 are stacked, with an air gap 40 interposed, in a direction (the Z-direction) perpendicular to the major surface of the substrate 10.

An insulating film 41 is provided between the major surface of the substrate 10 and the lowermost tungsten layer 70. An insulating film 42 is provided on the uppermost tungsten layer 70; and an insulating film 43 is provided on the insulating film 42.

The columnar portion CL includes a memory film 30, a semiconductor body 20, and an insulative core film 50. The semiconductor body 20, the memory film 30, and the core film 50 extend to be continuous along the stacking direction of the stacked body 100.

The semiconductor body 20 extends in a pipe-like configuration in the stacking direction (the Z-direction) through the stacked body 100. The memory film 30 is provided between the semiconductor body 20 and the tungsten layers 70, and surrounds the semiconductor body 20 from the outer circumferential side. The core film 50 is provided on the inner side of the semiconductor body 20 having the pipe-like configuration. The upper end of the semiconductor body 20 is connected to the bit line BL via the contacts Cb and V1 shown in FIG. 1.

Figure 3:
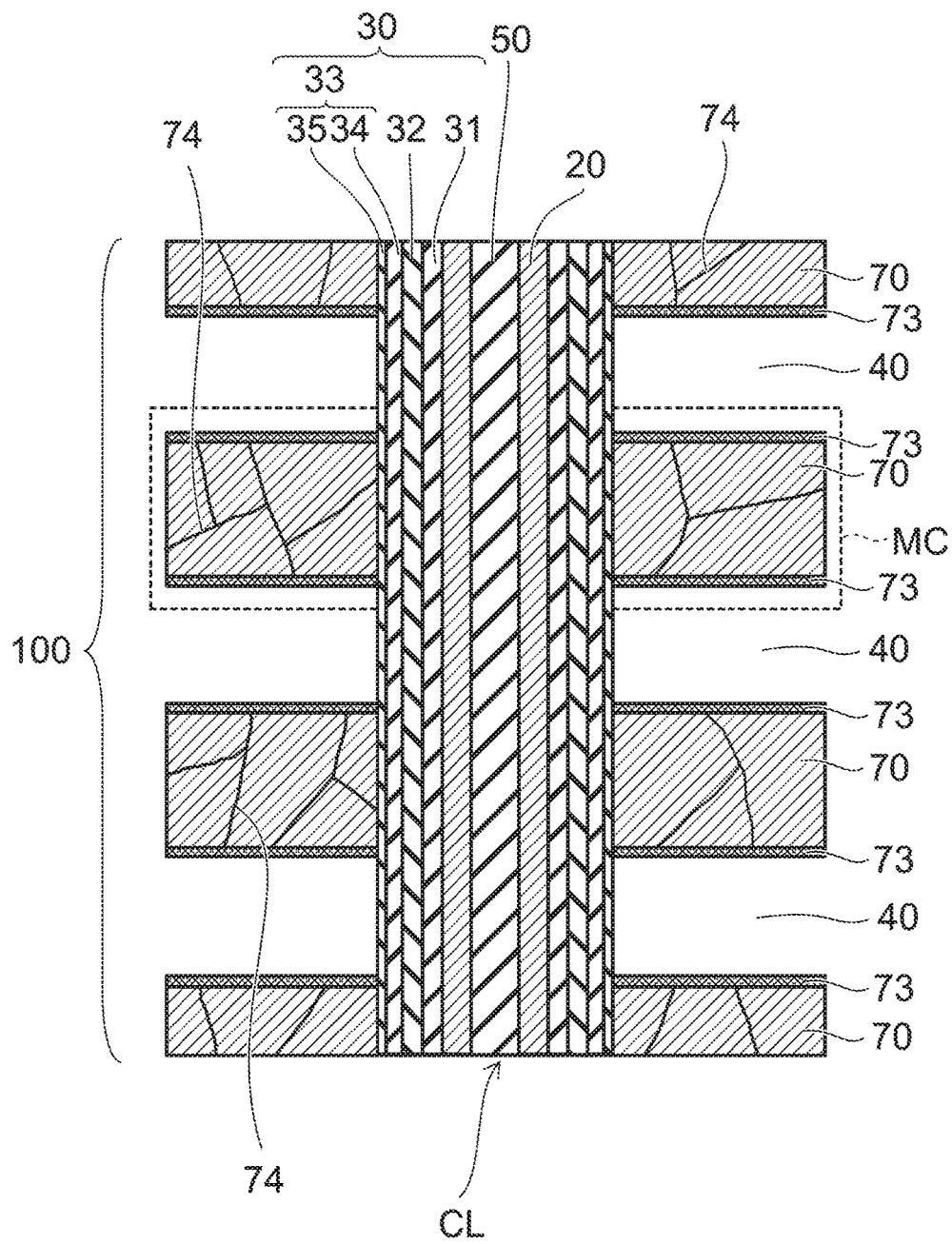
FIG. 3 is an enlarged cross-sectional view of one portion of FIG. 2.

FIG. 3 is an enlarged cross-sectional view of one portion of FIG. 2.

The memory film 30 is a stacked film including a tunneling insulating film 31, a charge storage film (a charge storage portion) 32, and a blocking insulating film 33. The blocking insulating film 33, the charge storage film 32, and the tunneling insulating film 31 are provided in order from the tungsten layer 70 side between the semiconductor body 20 and the tungsten layers 70. The tunneling insulating film 31 contacts the semiconductor body 20. The charge storage film 32 is provided between the blocking insulating film 33 and the tunneling insulating film 31.

The semiconductor body 20, the memory film 30, and the tungsten layer 70 are included in a memory cell MC. One memory cell MC is schematically illustrated by the broken line in FIG. 3. The memory cell MC has a vertical transistor structure in which the tungsten layer 70 surrounds, with the memory film 30 interposed, the periphery of the semiconductor body 20.

In the memory cell MC that has the vertical transistor structure, the semiconductor body 20 is, for example, a channel body of silicon; and the tungsten layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film. The charge storage film 32 includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32, or when the charge stored in the charge storage film 32 is released into the semiconductor body 20. The tunneling insulating film 31 includes, for example, a silicon oxide film.

The blocking insulating film 33 prevents the charge stored in the charge storage film 32 from being released into the tungsten layer 70. Also, the blocking insulating film 33 prevents back-tunneling of electrons from the tungsten layer 70 into the columnar portion CL.

The blocking insulating film 33 includes a first blocking film 34 and a second blocking film 35. The first blocking film 34 contacts the charge storage film 32 and extends to be continuous in the stacking direction of the stacked body 100. The second blocking film 35 is provided between the first blocking film 34 and the tungsten layer 70, and contacts the first blocking film 34. For example, the first blocking film 34 is a silicon oxide film; and the second blocking film 35 is a metal oxide film having a higher dielectric constant than the silicon oxide film. For example, the second blocking film 35 is an aluminum oxide film.

For example, a cover film such as a silicon nitride film, etc., may be formed between the tungsten layer 70 and the second blocking film 35 which is the metal oxide film. The cover film suppresses the oxidization of the tungsten layer 70 when forming the second blocking film (the metal oxide film) 35. Also, the cover film may include a nitride film (e.g., an aluminum nitride film) of the metal contained in the second blocking film (the metal oxide film) 35.

As shown in FIG. 1, a drain-side select transistor STD is provided at the upper end portion of the columnar portion CL; and a source-side select transistor STS is provided at the lower end portion of the columnar portion CL. For example, the lowermost tungsten layer 70 of the tungsten layers 70 functions as a control gate (a control electrode) of the source-side select transistor STS. For example, the uppermost tungsten layer 70 of the tungsten layers 70 functions as a control gate (a control electrode) of the drain-side select transistor STD.

The memory cells MC are provided between the drain-side select transistor STD and the source-side select transistor STS. The memory cells MC, the drain-side select transistor STD, and the source-side select transistor STS are connected in series via the semiconductor body 20, and included in one memory string. For example, the memory strings have a staggered arrangement in a planar direction parallel to the X-Y plane; and the memory cells MC are provided three-dimensionally in the X-direction, the Y-direction, and the Z-direction.

As shown in FIG. 2, an insulating film 63 is provided at two side surfaces in the Y-direction of the interconnect portion LI dividing the stacked body 100 in the Y-direction. The insulating film 63 is provided between the stacked body 100 and the interconnect portion LI. The insulating film 63 is not shown in FIG. 1.

The interconnect portion LI contains, for example, a metal such as tungsten, etc. The upper end of the interconnect portion LI is connected to the source line SL provided above the stacked body 100 via a contact Cs as shown in FIG. 1. The lower end of the interconnect portion LI contacts the substrate 10 as shown in FIG. 2. Also, the lower end of the semiconductor body 20 contacts the substrate 10.

The substrate 10 is, for example, a silicon substrate; and, for example, an active region (the p-type well) doped with a p-type impurity is formed in the front surface of the substrate 10. Accordingly, the lower end of the semiconductor body 20 is electrically connectable to the source line SL via the substrate 10 and the interconnect portion LI.

A semiconductor region 81 is formed in the front surface of the active region of the substrate 10 reached by the lower end of the interconnect portion LI. The plurality of semiconductor regions 81 are formed to correspond to the plurality of interconnect portions LI. The semiconductor regions 81 include a p-type region and an n-type region.

In a read-out operation, electrons are supplied from the interconnect portion LI to the semiconductor body 20 via the n-type semiconductor region 81 and the substrate 10. The interconnect portion LI connected to the n-type semiconductor region 81 is connected to the source line SL described above.

On the other hand, the p-type semiconductor region 81 supplies holes to the semiconductor body 20 via the substrate 10 in an erasing operation. The interconnect portion LI connected to the p-type semiconductor region 81 is connected to a not-shown upper layer interconnect provided on the stacked body 100.

The lowermost tungsten layer 70 is provided, with the insulating film 41 interposed, on the major surface of the substrate 10. By controlling a potential applied to the lowermost tungsten layer 70, a channel is induced in the front surface of the active region of the substrate 10 between the n-type semiconductor region 81 and the lower end of the semiconductor body 20, and then a current can be caused to flow between the n-type semiconductor region 81 and the lower end of the semiconductor film 20.

The lowermost tungsten layer 70 functions as a control gate (a control electrode) for inducing the channel (the inversion layer) in the front surface of the active region; and the insulating film 41 functions as a gate insulating film. Because the insulating film 41 provided between the front surface of the substrate 10 and the lowermost tungsten layer 70 is not an air gap and has a higher dielectric constant than air, high-speed driving is possible due to the capacitive coupling between the lowermost tungsten layer (the control electrode) 70 and the front surface of the substrate 10.

On the other hand, the air gap 40 is made between the control electrodes (the tungsten layers 70) of the memory cells adjacent to each other in the stacking direction (the Z-direction). Therefore, the interference between adjacent cells such as the threshold fluctuation due to the capacitive coupling between the tungsten layers 70 adjacent to each other in the stacking direction, etc., can be suppressed.

The tungsten layer 70 contains tungsten as a major component. The tungsten layer 70 is substantially a single-phase film of tungsten, and has the resistivity of tungsten.

As shown in FIG. 3, an alloy layer 73 of tungsten and molybdenum is provided on the surfaces (the upper surface and the lower surface) of the tungsten layer 70 opposing the air gap 40. The alloy layer 73 is thinner than the tungsten layer 70.

As described below, the tungsten layers 70 and the molybdenum layers are stacked alternately on the substrate 10; further, the air gap 40 is made by removing the molybdenum layers after forming the columnar portion CL. By the heat treatment performed after forming the stacked body of the tungsten layers 70 and the molybdenum layers, tungsten and molybdenum react at the interface between the tungsten layer 70 and the molybdenum layer; and the alloy layer 73 of tungsten and molybdenum is formed. Subsequently, the molybdenum layers are removed.

The alloy layer 73 on the surfaces of the tungsten layers may be some layer including an intermetallic compound, an eutectic compound, a solid solution, or their combination, and so on. The alloy layer 73 is formed by molybdenum reaction with tungsten, or molybdenum diffusion into tungsten crystal or tungsten grain boundary. The reliability will be improved based on these tungsten alloy formation with molybdenum.

An inter-layer insulating film for reinforcing the strength of the stacked body 100 may be formed to be interposed in a portion between the tungsten layers 70 adjacent to each other in the stacking direction after removing the molybdenum layers. It is sufficient for at least portions of the tungsten layers 70 to be stacked with the air gap 40 interposed.

The upper surface and lower surface of the tungsten layer 70 are not exposed in the air gap 40; and the alloy layer 73 is exposed in the air gap 40. The alloying of such front surfaces (the upper surface and the lower surface) of the tungsten layer 70 suppresses the migration of the tungsten atoms of the front surfaces. This suppresses the diffusion of the tungsten atoms into the memory film 30 and the semiconductor body 20, and increases the reliability of the device.

Also, at the crystal grain boundary which is the boundary between the adjacent crystal grains (crystal lattices), compared to the crystal grain interior, the atoms are sparse and the movement of the atoms occurs easily due to the disorder of the atomic arrangement. In other words, the tungsten atoms may move through the crystal grain boundary and diffuse to the memory film 30 side.

On the other hand, in the crystal grain boundary where the atoms are sparse, different types of atoms collect easily. Accordingly, in the heat treatment recited above in the state in which the tungsten layers 70 and the molybdenum layers are stacked, the molybdenum atoms of the molybdenum layer diffuse into the tungsten layer 70; and the molybdenum atoms are contained in a crystal grain boundary 74 of the tungsten layer 70. This makes it difficult for the tungsten atoms to move through the crystal grain boundary 74. The molybdenum atoms contained in the crystal grain boundary 74 of the tungsten layer 70 suppress the diffusion of the tungsten atoms into the memory film 30 and the semiconductor body 20, and increase the reliability of the device.

Because the number of molybdenum atoms contained in the alloy layer 73 and the crystal grain boundary 74 is extremely low compared to the number of tungsten atoms in the entire tungsten layer 70, there are substantially no effects of the molybdenum atoms on the electrical characteristics of the tungsten layer 70.

A method for forming the memory cell array 1 will now be described with reference to FIG. 4 to FIG. 14.

Figure 4:
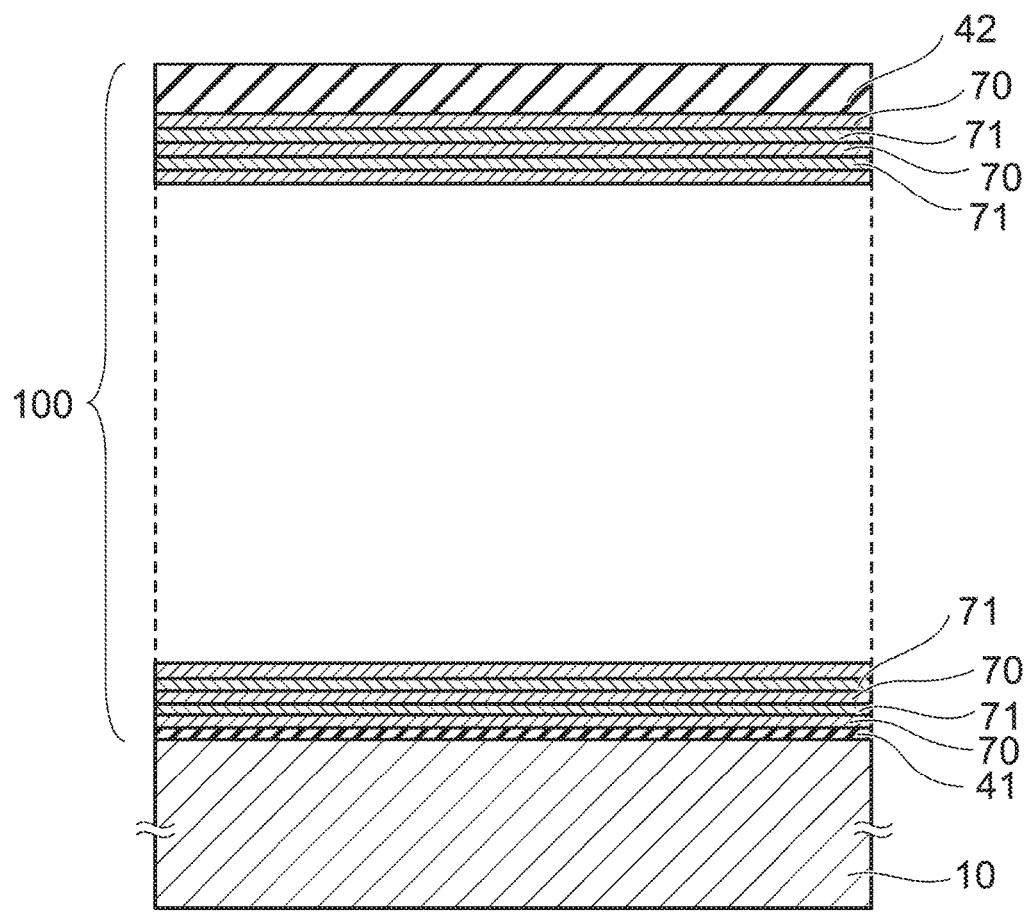
FIGS. 4 to 15B are schematic cross-sectional views showing a method for manufacturing the semiconductor device of the first embodiment.

As shown in FIG. 4, the stacked body 100 is formed on the substrate 10. The substrate 10 is, for example, a semiconductor substrate and is a silicon substrate.

The insulating film 41 is formed on the major surface of the substrate 10; and the tungsten layer 70 and a molybdenum layer 71 are stacked alternately on the insulating film 41. The process of alternately stacking the tungsten layer 70 and the molybdenum layer 71 is repeated; and the plurality of tungsten layers 70 and the plurality of molybdenum layers 71 are formed on the substrate 10. For example, the tungsten layers 70 and the molybdenum layers 71 are formed by chemical vapor deposition (CVD) or sputtering. For example, plasma enhanced chemical vapor deposition (PECVD) can be used as the CVD.

The film formation of the tungsten layers 70 and the molybdenum layers 71 is performed continuously inside a chamber of a vacuum state or a chamber having a reduced-pressure atmosphere. The wafer is not exposed to the ambient air in the film formation.

The insulating film 41 is provided between the substrate 10 and the lowermost tungsten layer 70; and the insulating film 42 is formed on the uppermost tungsten layer 70. The uppermost tungsten layer 70 is provided between the insulating film 42 and the uppermost molybdenum layer 71.

Figure 5:
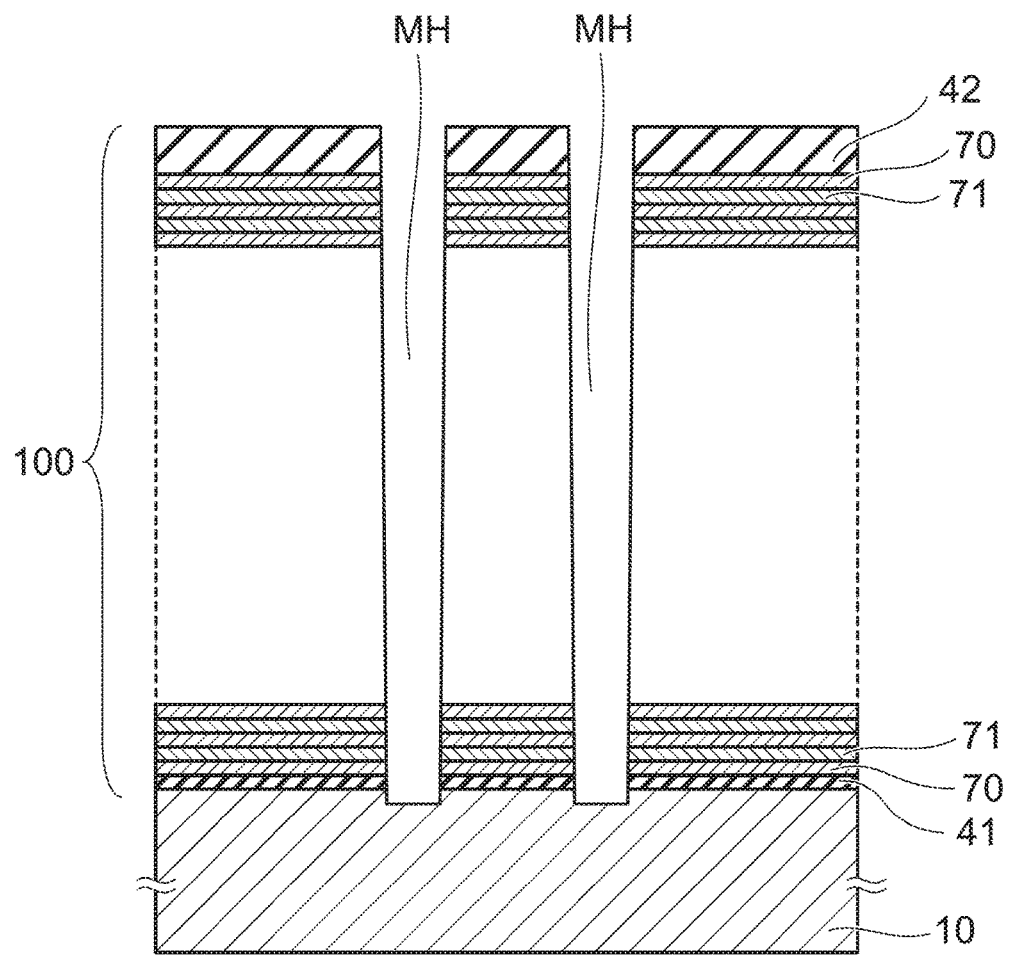

Then, a plurality of memory holes MH are made in the stacked body 100 as shown in FIG. 5. The memory holes MH are made by reactive ion etching (RIE) using a not-shown mask. The memory holes MH pierce the stacked body 100 and reach the substrate 10.

For example, the tungsten layers 70 and the molybdenum layers 71 are etched continuously by RIE using a gas containing fluorine without switching the gas. This makes high-throughput processing possible. For example, $NF_3$ gas, $CF_4$ gas, and $SF_6$ gas can be used as the gas containing fluorine. Or, the tungsten layers 70 and the molybdenum layers 71 may be etched while switching the gas.

Figure 6:
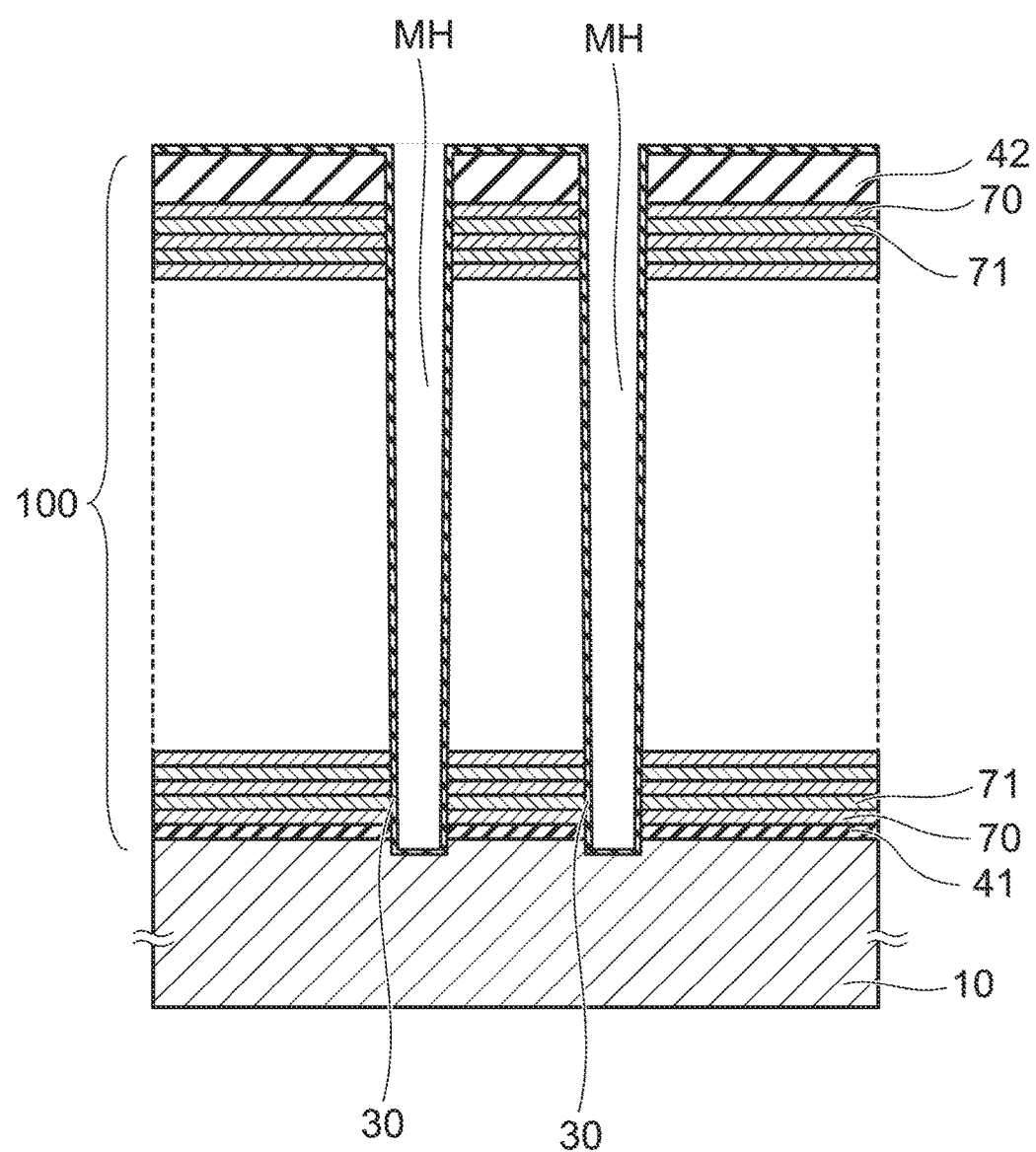
Figure 7:
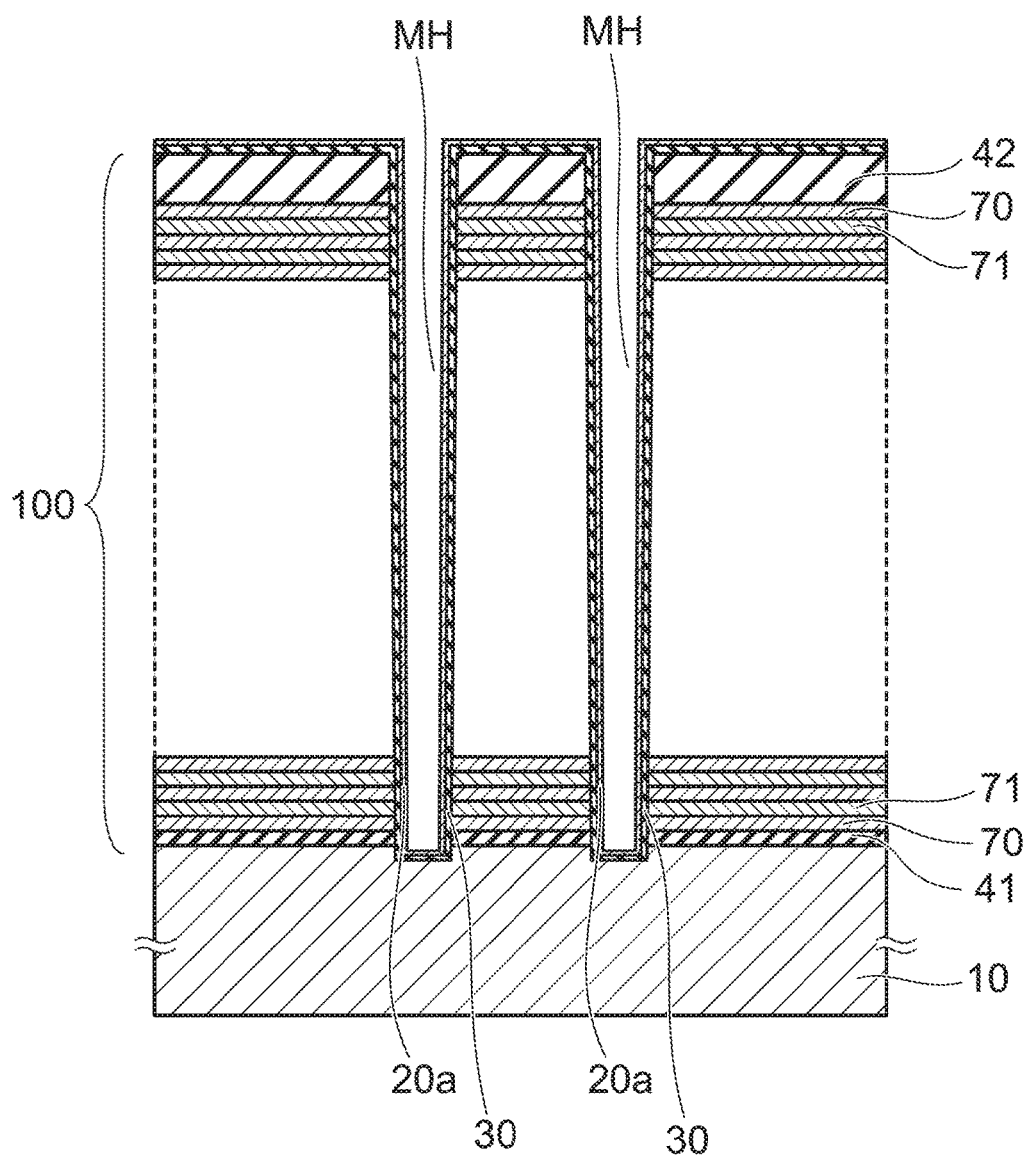

The memory film 30 is formed on the side surfaces and bottoms of the memory holes MH as shown in FIG. 6; and a cover film 20a is formed on the inner side of the memory film 30 as shown in FIG. 7.

Figure 8:
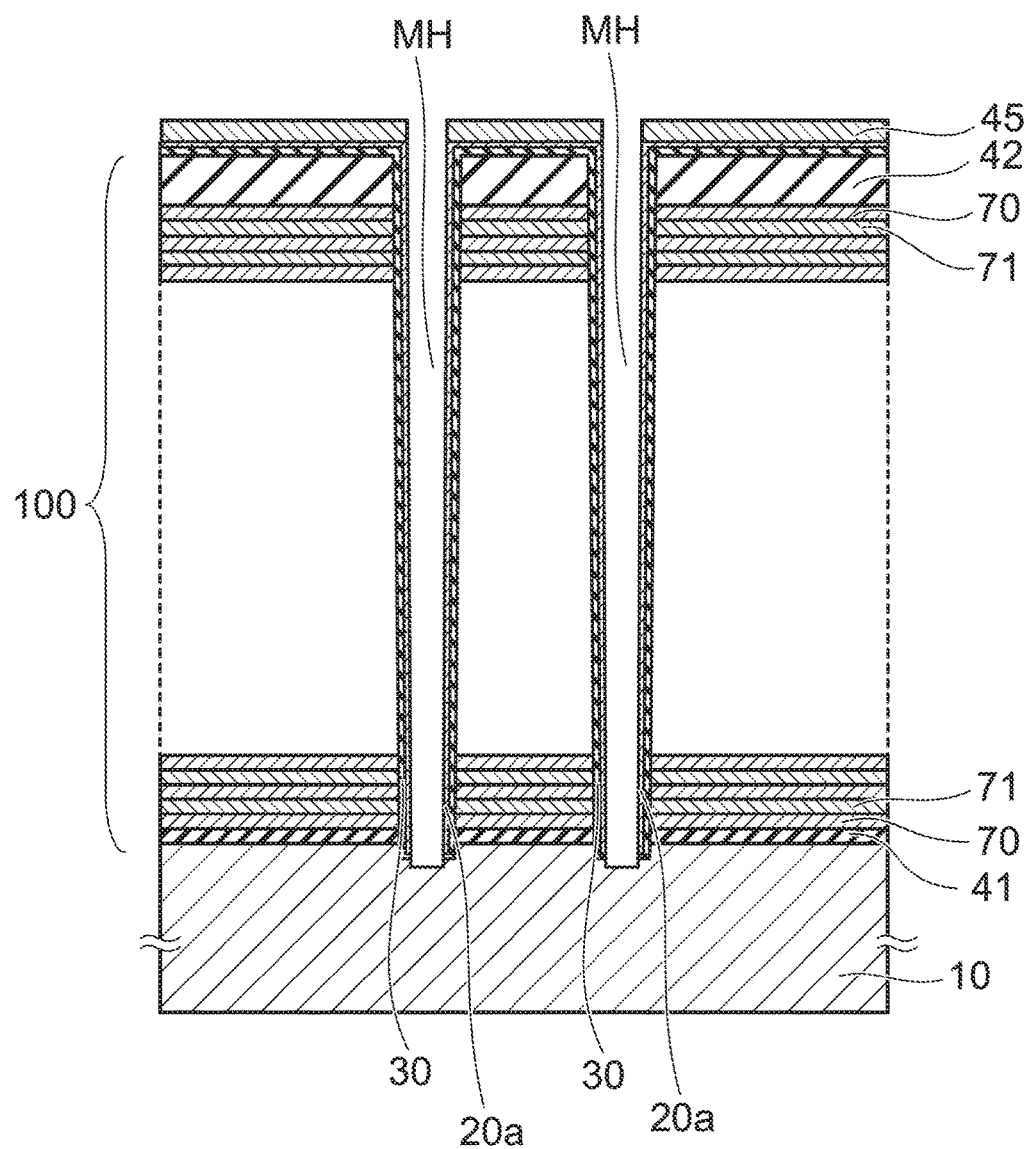
Figure 9:
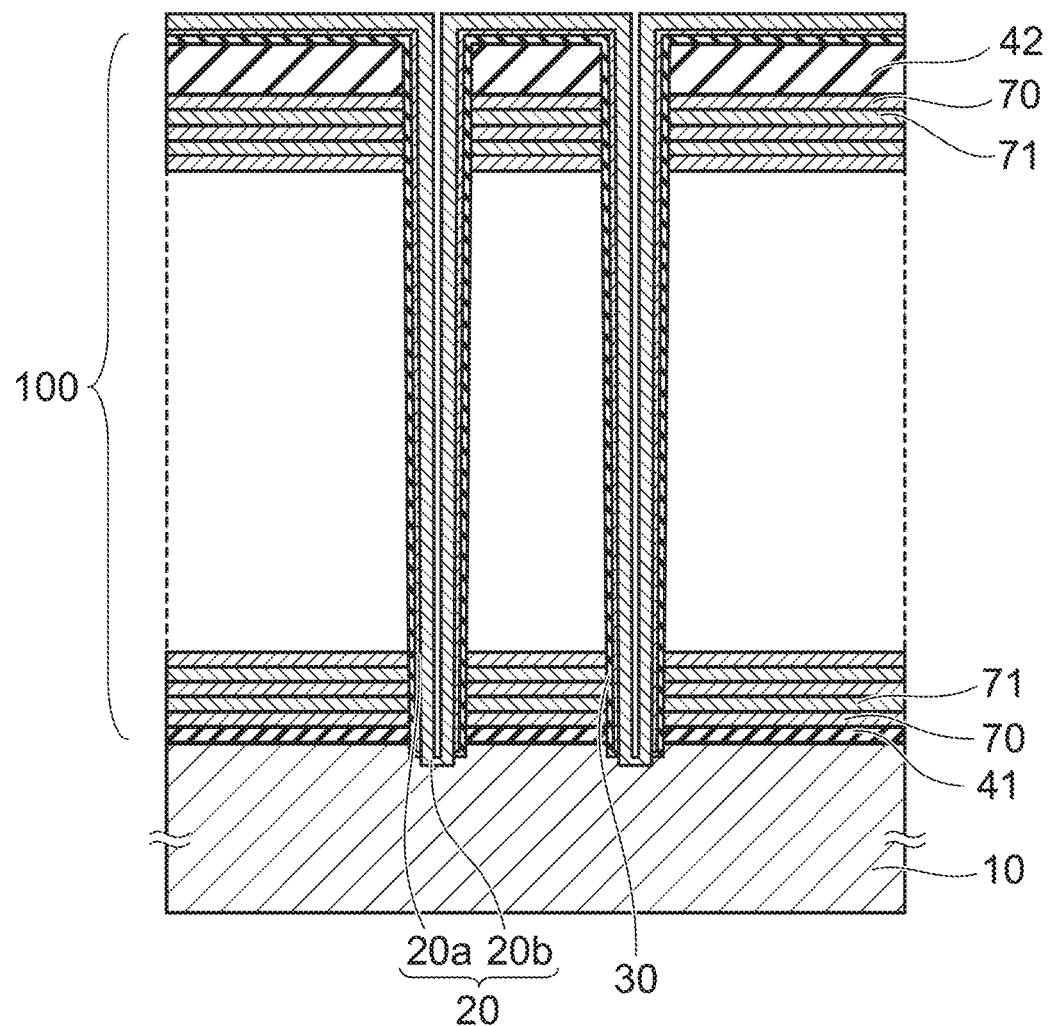

As shown in FIG. 8, a mask layer 45 is formed on the upper surface of the stacked body 100; and the cover film 20a and the memory film 30 that are formed on the bottoms of the memory holes MH are removed by RIE. In the RIE, the memory film 30 formed on the side surfaces of the memory holes MH is covered with and protected by the cover film 20a. Accordingly, the memory film 30 formed on the side surfaces of the memory holes MH is not damaged by the RIE.

After removing the mask layer 45, a semiconductor film 20b is formed inside the memory holes MH as shown in FIG.

9. The semiconductor film 20b is formed on the side surface of the cover film 20a and the bottoms of the memory holes MH where the substrate 10 is exposed.

For example, the cover film 20a and the semiconductor film 20b are formed as amorphous silicon films and subsequently crystallized into polycrystalline silicon films by heat treatment. The cover film 20a and the semiconductor film 20b are included in the semiconductor body 20 described above.

Figure 10:
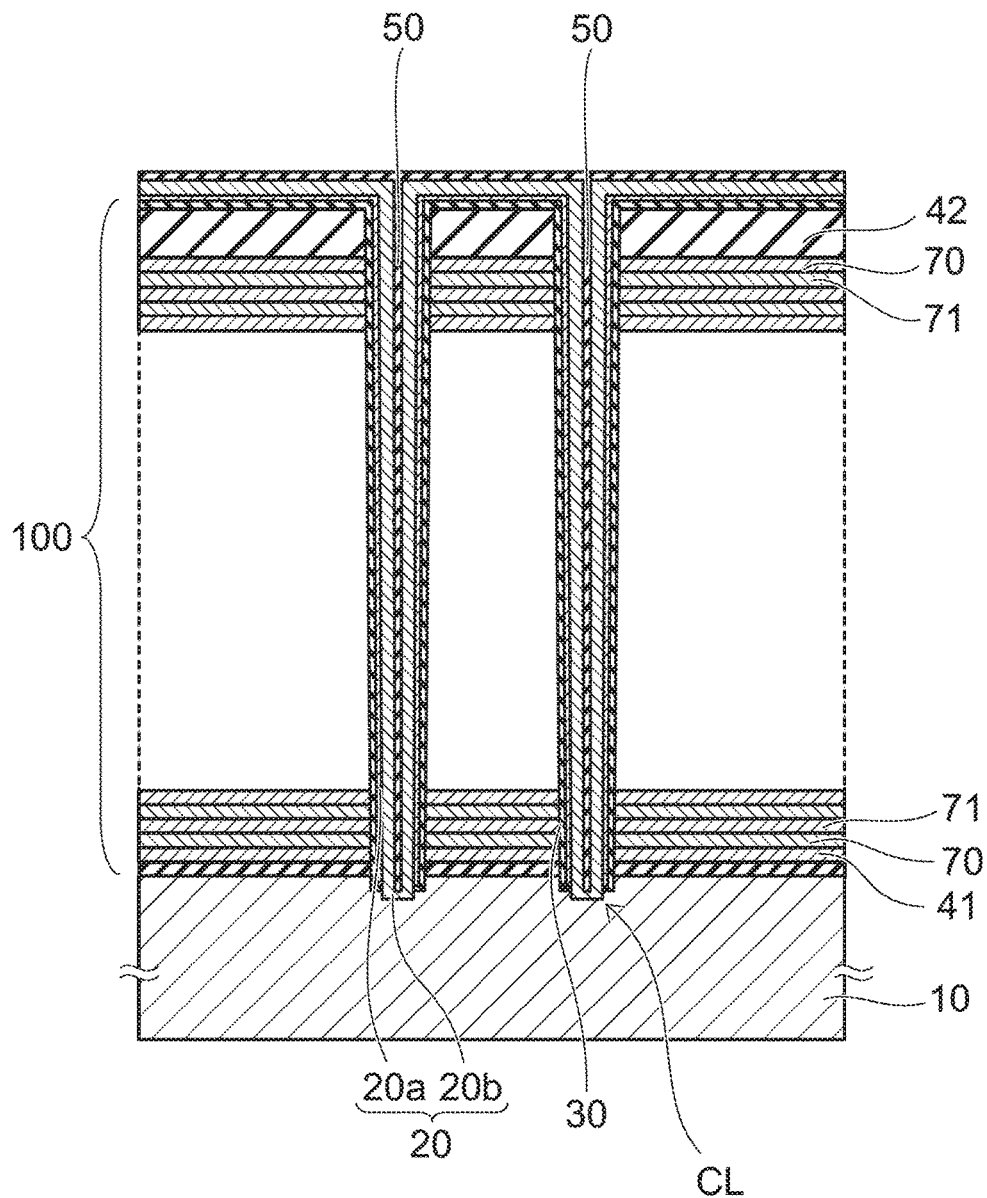

As shown in FIG. 10, the core film 50 is formed on the inner side of the semiconductor film 20b; and the columnar portion CL is thereby formed.

The process of forming the columnar portion CL includes heat treatment for film property improvement, crystallizing, and activating. Or, heat treatment is performed after forming the columnar portion. For example, the heat treatment is performed at a temperature of about 1000° C. to crystallize or activate the semiconductor body 20.

Tungsten and molybdenum do not melt when the heat treatment is performed because the melting points of tungsten and molybdenum are sufficiently higher than the heat treatment temperature of the columnar portion CL.

Figure 14:
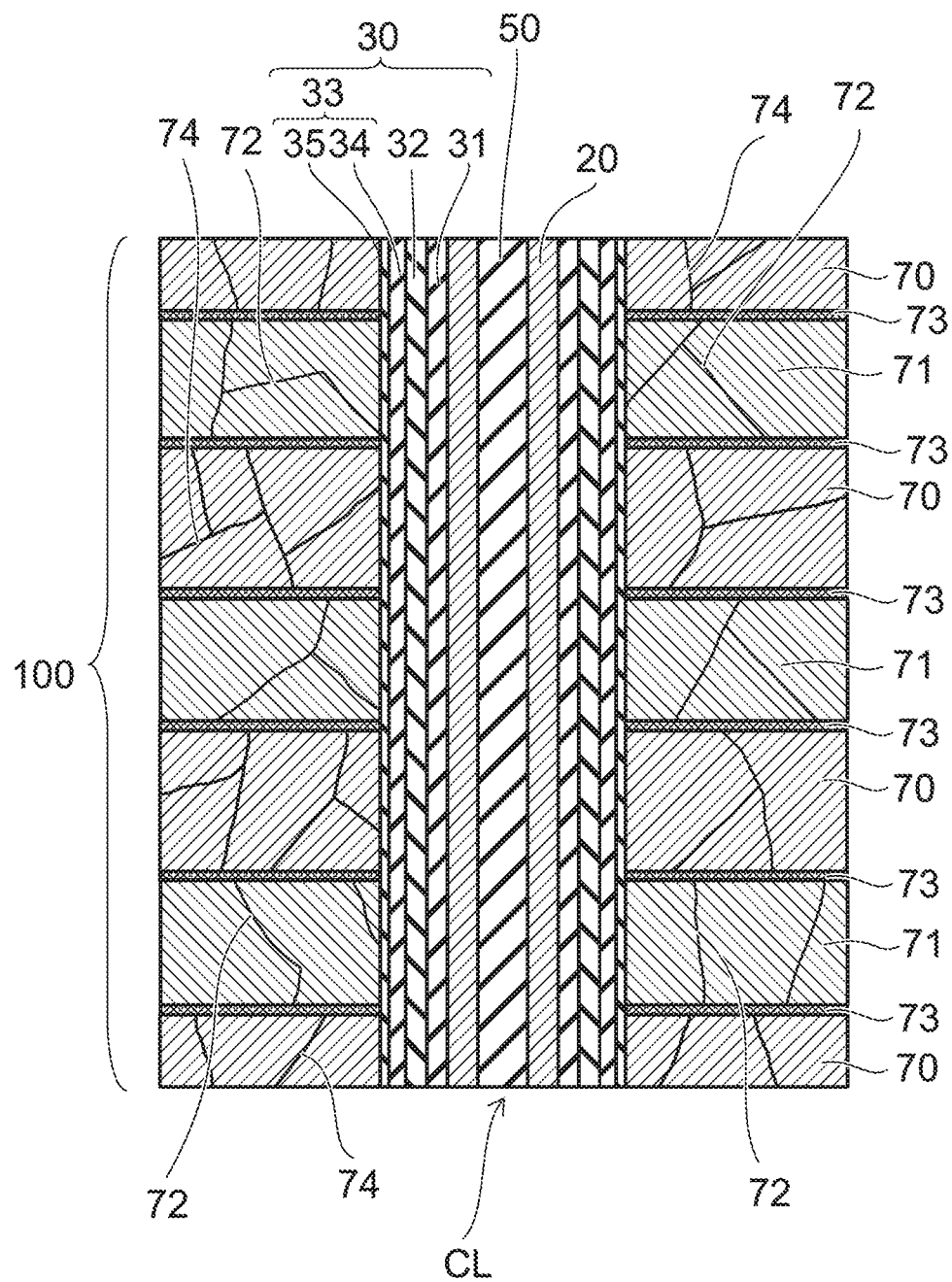

Also, in the heat treatment of the columnar portion CL, tungsten and molybdenum react at the interface between the tungsten layer 70 and the molybdenum layer 71; and the alloy layer 73 of tungsten and molybdenum is formed at the interface between the tungsten layer 70 and the molybdenum layer 71 as shown in FIG. 14.

Further, the molybdenum atoms of the molybdenum layer 71 diffuse into the crystal grain boundary 74 of the tungsten layer 70. Conversely, the tungsten atoms of the tungsten layer 70 diffuse into a crystal grain boundary 72 of the molybdenum layer 71.

Or, the diffusion of the tungsten and the molybdenum into the grain boundary, and the formation of the alloy layer 73 by the heat treatment of the stacked body 100 may be caused to progress prior to forming the columnar portion CL.

In such a case, it is desirable for the heat treatment to be implemented prior to making the memory holes MH. In the heat treatment at a timing after the memory holes MH are made and prior to burying the columnar portion CL, an unevenness may be formed in the side surfaces of the memory holes MH by grooving of the side surfaces of the tungsten layers 70 and the molybdenum layers 71 exposed at the side surfaces of the memory holes MH.

Also, the heat treatment prior to the formation of the columnar portion CL relaxes the stress of the stacked body 100 and suppresses the warp of the wafer.

Figure 11:
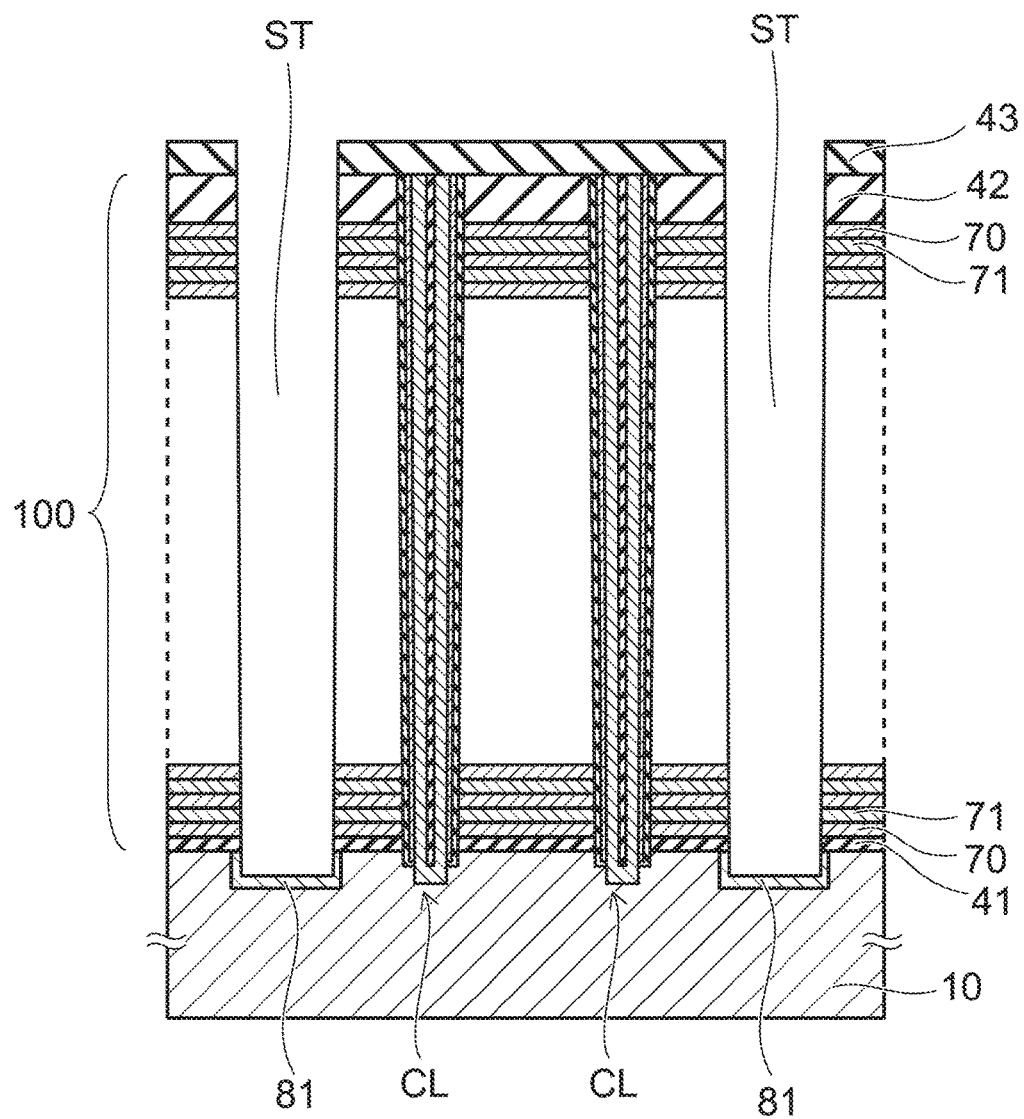

The films deposited on the insulating film 42 shown in FIG. 10 are removed by chemical mechanical polishing (CMP) or etch-back; and subsequently, the insulating film 43 is formed on the insulating film 42 as shown in FIG. 11.

Then, a plurality of slits ST are made in the stacked body 100 by RIE using a not-shown mask. The slits ST pierce the insulating film 43 and the stacked body 100, and reach the substrate 10. Similarly to when making the memory holes MH, for example, the tungsten layers 70 and the molybdenum layers 71 are etched continuously by RIE using a gas containing fluorine. Or, the tungsten layers 70 and the molybdenum layers 71 are etched while switching the gas.

The p-type or n-type semiconductor region 81 is formed in the front surface of the substrate 10 at the bottoms of the slits ST by implanting an impurity by ion implantation into the substrate 10 exposed at the bottoms of the slits ST.

Figure 12:
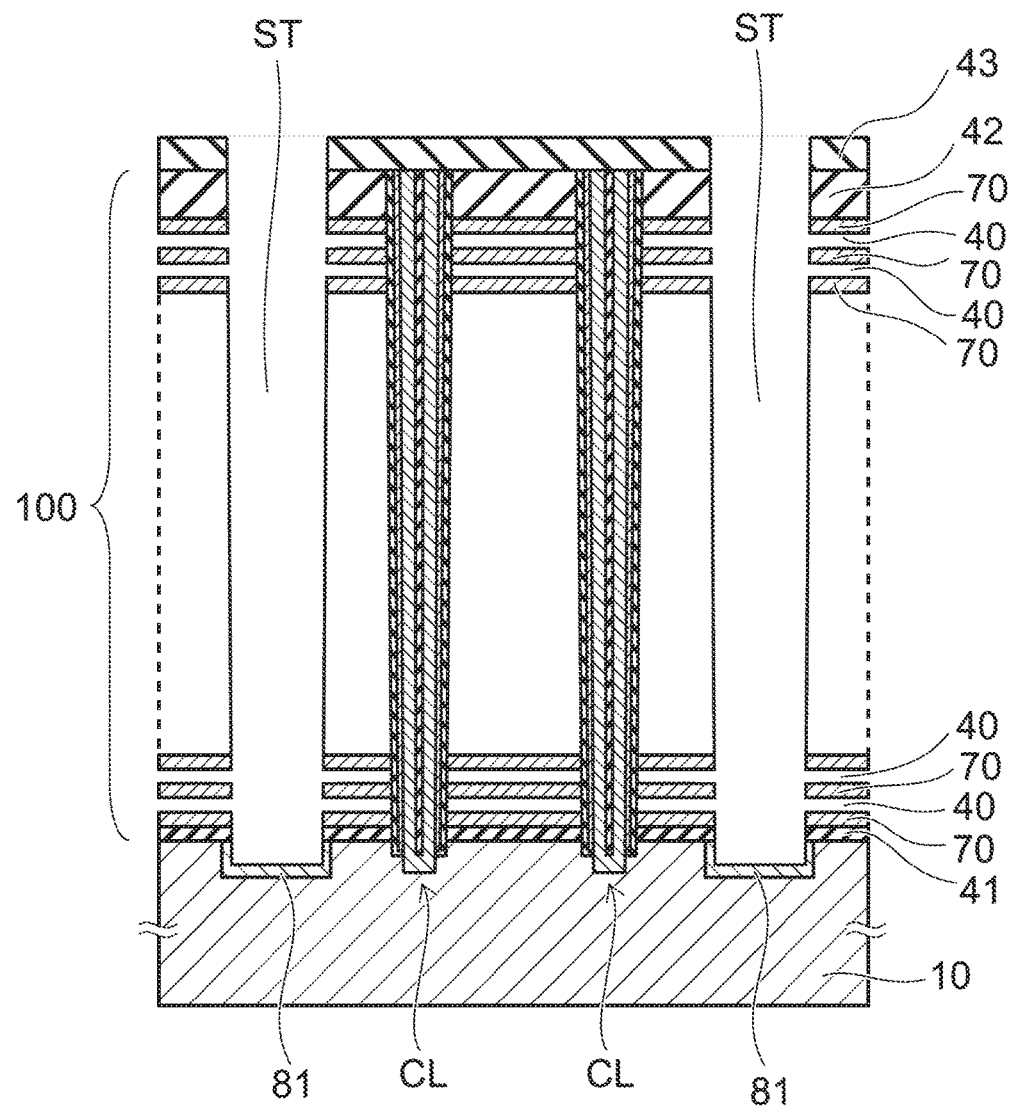

Then, the molybdenum layers 71 are removed by etching through the slits ST. By removing the molybdenum layers 71, the air gap 40 is made between the tungsten layers 70 adjacent to each other above and below as shown in FIG. 12.

For example, the molybdenum layers 71 are selectively removed using an acidic etchant that contains an oxidizing agent and has oxidizing capability for the molybdenum layers 71. The tungsten layers 70 and the alloy layers 73 of tungsten and molybdenum remain.

The oxidizing agent recited above is, for example, nitric acid or hydrogen peroxide. Also, a mixed liquid of hydrochloric acid and the oxidizing agent recited above, a mixed liquid of sulfuric acid and the oxidizing agent recited above, or a mixed liquid of phosphoric acid and the oxidizing agent recited above may be used as the etchant that selectively etches the molybdenum layers 71.

Or, selective etching of the molybdenum layers 71 is possible also by using an alkaline liquid having oxidizing capability for the molybdenum layers 71 by appropriately controlling the composition, the processing time, and the temperature.

The etching selectivity of the molybdenum layers 71 with respect to the tungsten layers 70 using an acidic etchant is, for example, 1000 or more, and is higher than the selectivity in the case where an alkaline liquid is used.

The outermost surface of the blocking insulating film 33 provided on the outermost circumference of the columnar portion CL is, for example, an aluminum oxide film; and the etching selectivity of the molybdenum layers 71 using the etchant recited above with respect to the aluminum oxide film also is sufficiently high.

Figure 13:
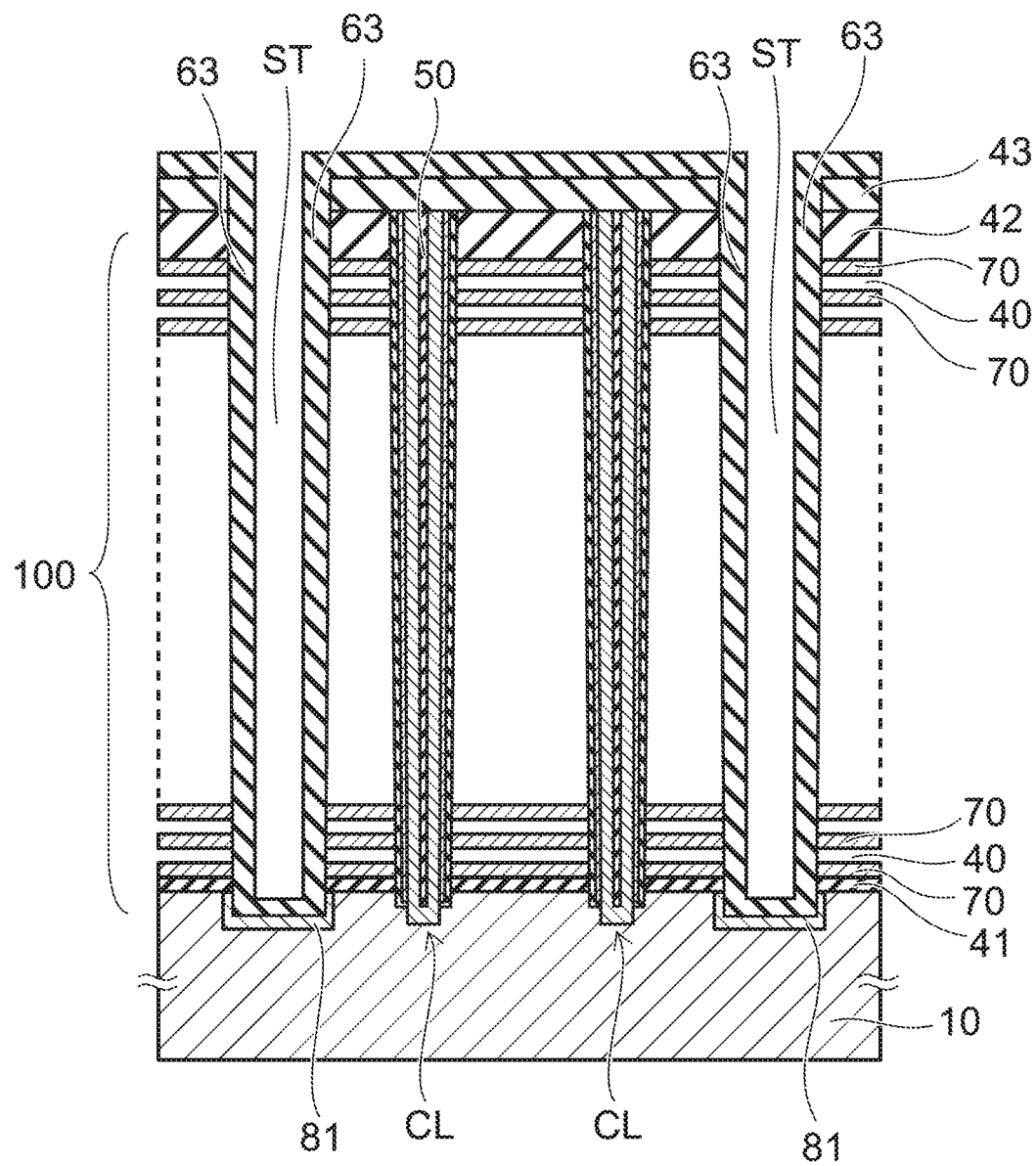

After removing the molybdenum layers 71, the insulating film 63 is formed on the side surfaces and bottoms of the slits ST as shown in FIG. 13. After removing the insulating film 63 formed on the bottoms of the slits ST by RIE, the interconnect portion LI is buried in the slits ST as shown in FIG. 2. The lower end of the interconnect portion LI is connected to the substrate 10 via the semiconductor region 81. Subsequently, the bit lines BL, the source line SL, etc., shown in FIG. 1 are formed.

In the case where the alloy layer 73 becomes thick at conditions where the height (the thickness) of the entire stacked body 100 does not change, the tungsten layer 70 becomes relatively thin; and this may cause an increase of the resistance of the tungsten layer 70. Also, an excessive diffusion of the molybdenum atoms into the grain boundary 74 of the tungsten layer 70 also may cause the increase of the resistance of the tungsten layer 70.

Accordingly, it is desirable to appropriately control the interface reaction between the tungsten layer 70 and the molybdenum layer 71, and the diffusion of the molybdenum atoms into the tungsten layer 70.

Figure 15A:
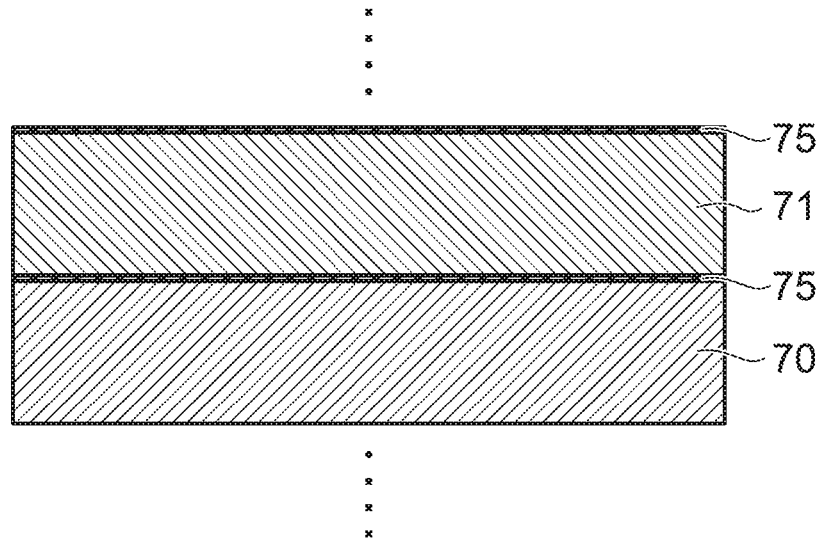

When alternately stacking the tungsten layers 70 and the molybdenum layers 71, an intermediate film 75 can be formed as a control layer of the alloying reaction and the atomic diffusion at the interface between the tungsten layer 70 and the molybdenum layer 71 as shown in FIG. 15A.

For example, a tungsten oxide film of 1 nm or less is formed as the intermediate film 75 on the upper surface of the tungsten layer 70 after forming the tungsten layer 70. For example, the upper surface of the tungsten layer 70 is oxidized by introducing oxygen gas having a film formation pressure of 1% to 10% inside a film formation chamber. Or, at this time, a tungsten oxynitride film of 1 nm or less may be formed as the intermediate film 75 on the upper surface of the tungsten layer 70 by introducing a gas containing oxygen and nitrogen.

Similarly, a molybdenum oxide film of 1 nm or less is formed as the intermediate film 75 on the upper surface of the molybdenum layer 71 after forming the molybdenum layer 71. For example, the upper surface of the molybdenum layer 71 is oxidized by introducing oxygen gas having a film formation pressure of 1% to 10% inside a film formation chamber. Or, at this time, a molybdenum oxynitride film of 1 nm or less may be formed as the intermediate film 75 on the upper surface of the molybdenum layer 71 by introducing a gas containing oxygen and nitrogen.

The intermediate film 75 may be a nitride film of tungsten or a nitride film of molybdenum.

Figure 15B:
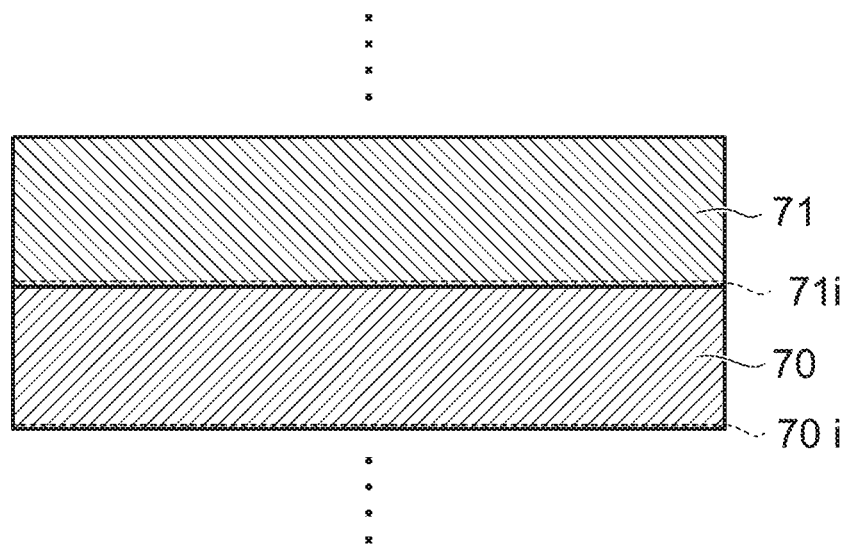

Or, an initial film 70i that contains oxygen may be formed as a control layer of the alloying reaction and the atomic diffusion as shown in FIG. 15B by introducing oxygen gas inside the film formation chamber in the initial film formation of the tungsten layer 70. Or, the initial film 70i that contains oxygen and nitrogen may be formed by introducing a gas containing oxygen and nitrogen inside the film formation chamber in the initial film formation of the tungsten layer 70. Or, the initial film 70i that contains nitrogen may be formed by introducing a gas containing nitrogen inside the film formation chamber in the initial film formation of the tungsten layer 70.

Similarly, an initial film 71i that contains oxygen may be formed as a control layer by introducing oxygen gas inside the film formation chamber in the initial film formation of the molybdenum layer 71. Or, the initial film 71i that contains oxygen and nitrogen may be formed by introducing a gas containing oxygen and nitrogen inside the film formation chamber in the initial film formation of the molybdenum layer 71. Or, the initial film 71i that contains nitrogen may be formed by introducing a gas containing nitrogen inside the film formation chamber in the initial film formation of the molybdenum layer 71.

The initial films 70i and 71i recited above are formed at the interface between the tungsten layer 70 and the molybdenum layer 71.

Also, both of the intermediate film 75 shown in FIG. 15A and the initial films 70i and 71i shown in FIG. 15B may be formed as control layers of the alloying reaction and the atomic diffusion.

The forming of the tungsten layers 70, the forming of the molybdenum layers 71, and the forming of the control layers recited above are performed continuously inside a chamber of a vacuum state or a chamber having a reduced-pressure atmosphere. The wafer is not exposed to the ambient air in the film formation.

The control layer recited above that is formed at the interface between the tungsten layer 70 and the molybdenum layer 71 appropriately controls the atomic diffusion and the alloying of tungsten and molybdenum in subsequent heat treatment, suppresses an excessive increase of the film thickness of the alloy layer 73, and the excessive diffusion of the molybdenum atoms into the grain boundary 74 of the tungsten layer 70, and suppresses the resistance increase of the tungsten layer 70.

The control layer recited above is 1 nm or less and is extremely thin, and does not impede the alloying at the interface between the tungsten layer 70 and the molybdenum layer 71. For example, the alloy layer 73 formed by the heat treatment of the stacked body 100 including the control layer recited above may contain at least one of oxygen and nitrogen.

A semiconductor device of a second embodiment will now be described.

In the drawings, the same components as those of the first embodiment are marked with the same reference numerals.

Figure 16:
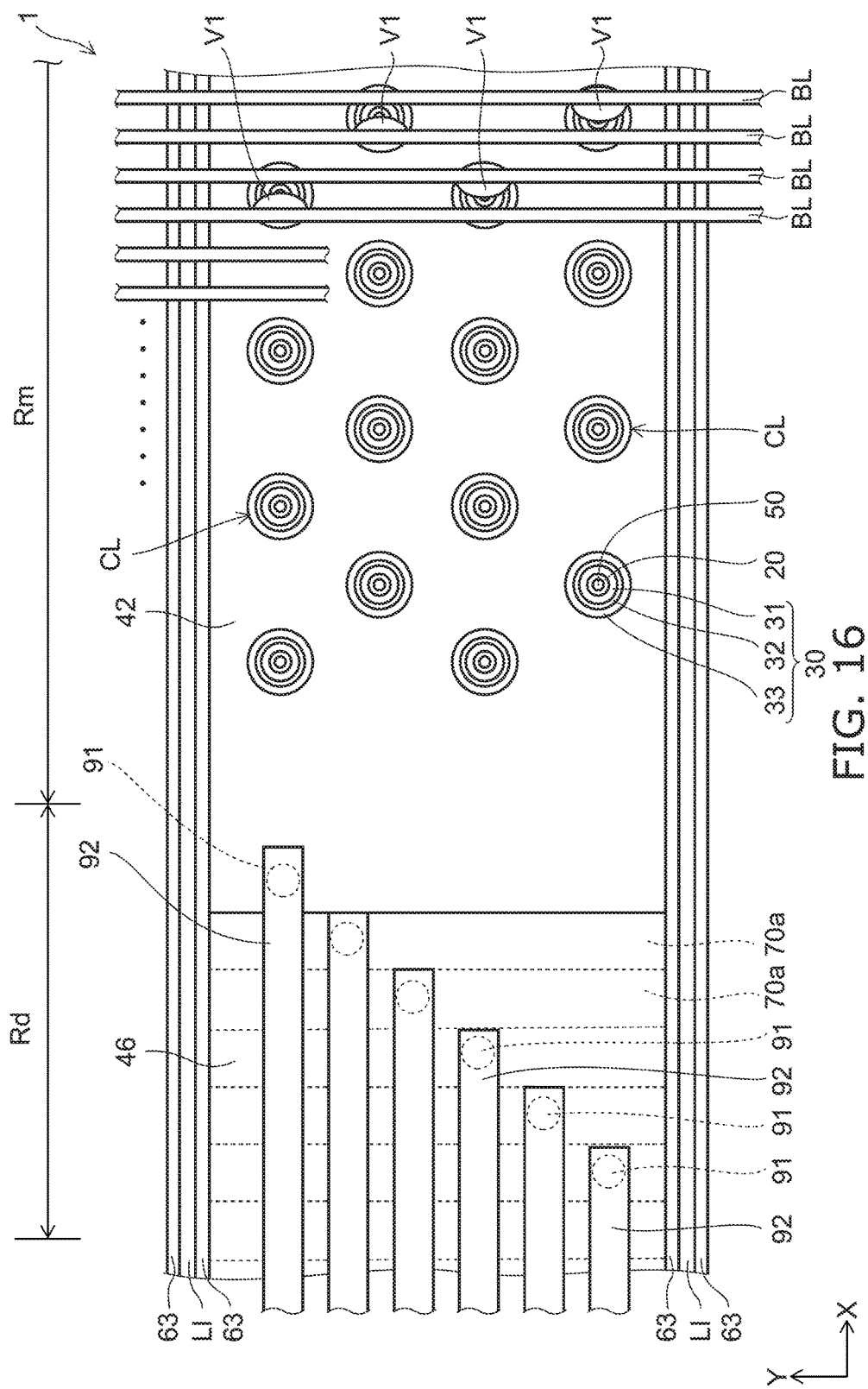
FIG. 16 is a schematic plan view of a semiconductor device of a second embodiment.

FIG. 16 is a schematic plan view of the semiconductor device of the second embodiment.

Figure 17:
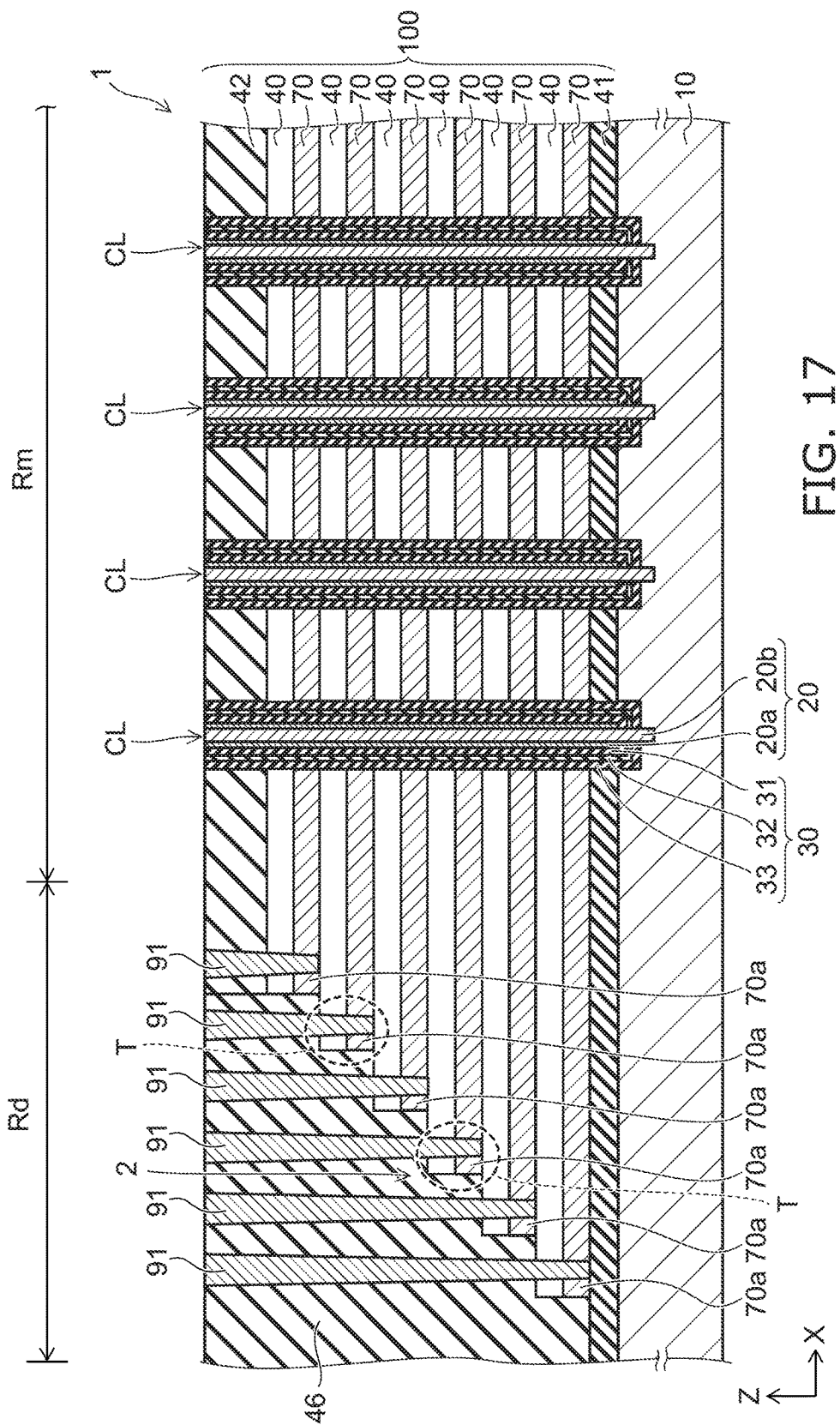
FIG. 17 is a schematic cross-sectional view of the semiconductor device of the second embodiment.

FIG. 17 is a schematic cross-sectional view of the semiconductor device of the second embodiment.

The X, Y, and Z-directions shown in FIG. 16 and FIG. 17 correspond respectively to the X, Y, and Z-directions shown in FIG. 1.

The semiconductor device of the second embodiment includes the substrate 10. The substrate 10 includes a memory cell array region Rm and a peripheral region Rd.

The memory cell array 1 that has structural features similar to those of the first embodiment is provided in the memory cell array region Rm. The core film 50 is not shown in the cross section of the columnar portion CL shown in FIG. 17; and this is similar throughout the second embodiment hereinbelow. Also, the insulating film 43 is not shown in FIG. 16 and FIG. 17 as well.

In the memory cell array 1 of the second embodiment, the molybdenum atoms may not diffuse into the crystal grain boundary 74 of the tungsten layer 70, and the alloy layer 73 described above.

As shown in FIG. 17, the stacked body 100 including the tungsten layers 70 stacked with the air gap 40 interposed is provided on the substrate 10.

In the second embodiment, the tungsten layer 70 contains nitrogen. The nitrogen content of the tungsten layer 70 is, for example, $1 \times 10^{21}/cm^3$ or less. The nitrogen content of the tungsten layer 70 is, for example, about $1 \times 10^{20}/cm^3$.

The stacked body 100 is formed also in the peripheral region Rd. The air gap 40 is made between the tungsten layers 70 in the peripheral region Rd as well.

The stacked body 100 in the peripheral region Rd includes a stairstep portion 2. In the stairstep portion 2, the tungsten layers 70 are patterned into a stairstep configuration.

The stairstep portion 2 includes a plurality of terrace portions T arranged in a stairstep configuration having a difference in levels along the X-direction. The tungsten layers 70a of the terrace portions T are arranged in a stairstep configuration having a difference in levels along the X-direction.

An insulating layer 46 is provided on the stairstep portion 2. The end surfaces in the X-direction of the tungsten layers 70a of the terrace portions T are covered with the insulating layer 46. The upper surfaces of the tungsten layers 70a of the terrace portions T oppose the insulating layer 46 with the air gap 40 interposed.

A plurality of contacts 91 extending in the Z-direction are provided inside the insulating layer 46. The lower end portions of the contacts 91 respectively contact the tungsten layers 70a of the corresponding terrace portions T. The uppermost tungsten layer 70 is connected to the contact 91 piercing the insulating film 42.

In the example shown in FIG. 17, the tungsten layer 70a of the terrace portion T is provided to surround the side surface of the lower end portion of the contact 91, and contacts the side surface of the lower end portion of the contact 91. The air gap 40 is interposed between the lower surface of the lower end portion of the contact 91 and another tungsten layer 70 under the lower surface of the lower end portion of the contact 91.

The contacts 91 are conductors containing a metal; and the contacts 91 are connected respectively to upper layer interconnects 92 provided on the insulating layer 46 shown in FIG. 16. The upper layer interconnects 92 extend in the X-direction.

The tungsten layer 70 of the memory cell array 1 is electrically connected to the upper layer interconnect 92 via the contact 91 and the tungsten layer 70a of the terrace portion T. The upper layer interconnect 92 is electrically connected to a not-shown control circuit formed in the front surface of the substrate 10.

A method for manufacturing the semiconductor device of the second embodiment will now be described with reference to FIG. 18 to FIG. 27B.

The insulating film 41 is formed on the major surface of the substrate 10. The tungsten layer 70 as a first layer, and a nitrogen-containing molybdenum layer (hereinbelow, also called simply the molybdenum layer) 71N as a second layer are stacked alternately on the insulating film 41. The tungsten layer 70 contains tungsten as a major component. The nitrogen-containing molybdenum layer 71N contains molybdenum as a major component and further contains nitrogen. The tungsten layers 70 and the molybdenum layers 71N are formed by CVD or sputtering.

Figure 18:
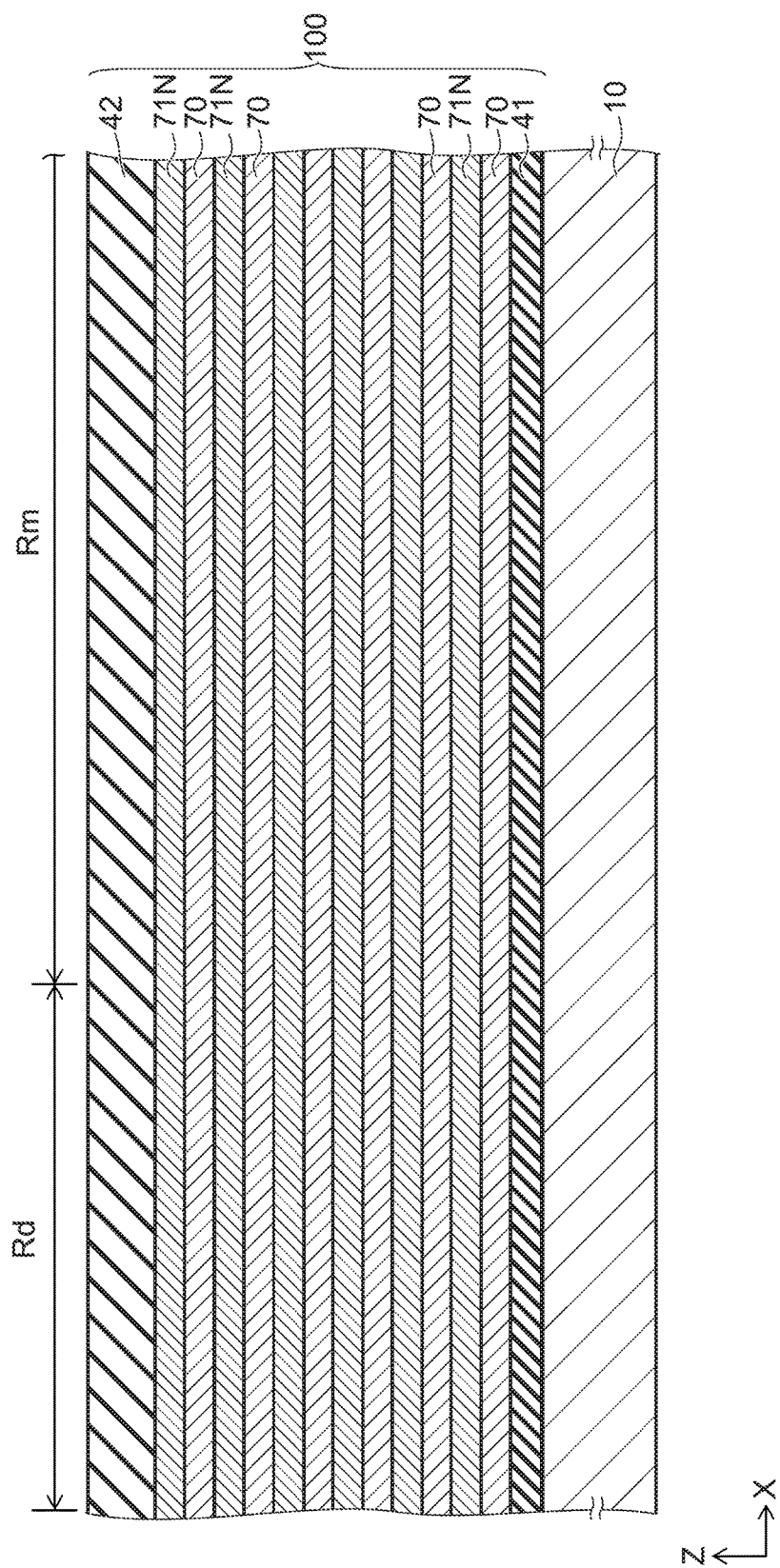

The process of alternately stacking the tungsten layer 70 and the molybdenum layer 71N is repeated; and the plurality of tungsten layers 70 and the plurality of molybdenum layers 71N are formed on the substrate 10. The insulating film 42 is formed on the uppermost molybdenum layer 71N. In FIG. 18, the insulating film 42 may be formed on the uppermost tungsten layer 70 similar to that of the first embodiment without forming the uppermost molybdenum layer 71N.

The stacked body 100 that includes the insulating film 41, the tungsten layers 70, the molybdenum layers 71N, and the insulating film 42 is formed not only in the memory cell array region Rm but also in the peripheral region Rd.

The nitrogen composition ratio of the molybdenum layer 71N is lower than the nitrogen composition ratio of molybdenum nitride (MoN) having a 1:1 composition ratio of molybdenum and nitrogen. For example, the nitrogen composition ratio of the molybdenum layer 71N is about 20 atomic %.

Figure 19:
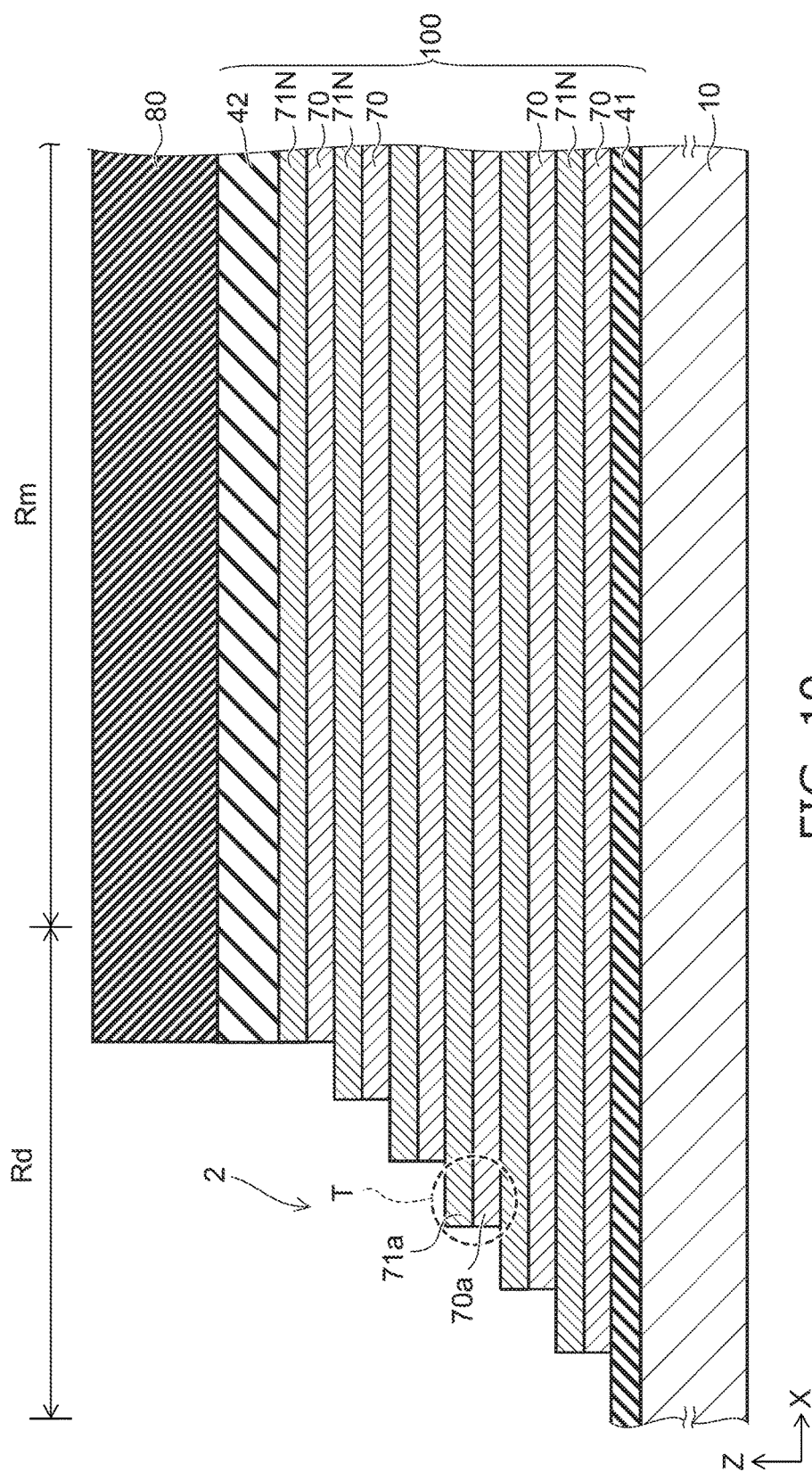

Then, as shown in FIG. 19, a portion of the stacked body 100 is patterned into a stairstep configuration. The stairstep portion 2 having the terrace portions T is formed in the portion of the stacked body 100.

The molybdenum layers 71N and the tungsten layers 70 in the region exposed from a resist film 80 each are removed by etching one layer at a time by RIE using the resist film 80 formed on the stacked body 100 as a mask. The slimming that reduces the X-direction size of the resist film 80 and the etching of the molybdenum layers 71N and the tungsten layers 70 using the resist film 80 as a mask is multiply repeated; and the stairstep portion 2 is formed.

In the RIE, for example, an etching gas containing fluorine is used. For example, $NF_3$ gas, $CF_4$ gas, and $SF_6$ gas can be used as the gas containing fluorine.

The molybdenum layers 71N and the tungsten layers 70 are etched by the same etching gas without switching the etching gas between etching the molybdenum layers 71N and etching the tungsten layers 70. This makes high-throughput processing possible.

The molybdenum layer 71N contains nitrogen; and the nitrogen concentration of the molybdenum layer 71N is higher than the nitrogen concentration of the tungsten layer 70. The molybdenum layer 71N contains more nitrogen than the tungsten layer 70.

Because the property of such a molybdenum layer 71N containing nitrogen are nearly the property of an intermetallic compound, and the molybdenum layer 71N is harder than a molybdenum layer not containing nitrogen, the etching rate of the nitrogen-containing molybdenum layer 71N is slower than that of the tungsten layer 70 when the etching using a gas containing, for example, fluorine.

Accordingly, the molybdenum layer 71N functions as an etching stopper and makes it easy to control the stopping of the etching of one layer of the tungsten layers 70 at the timing when the molybdenum layer 71N under the one layer of the tungsten layers 70 is exposed. The molybdenum layer 71N is exposed at the upper surface of each terrace portion T. The etching that uses such a molybdenum layer 71N as a stopper makes it easy to form the terrace portion T including the stacked film of one layer of the molybdenum layers 71a and one layer of the tungsten layers 70a.

Figure 20:
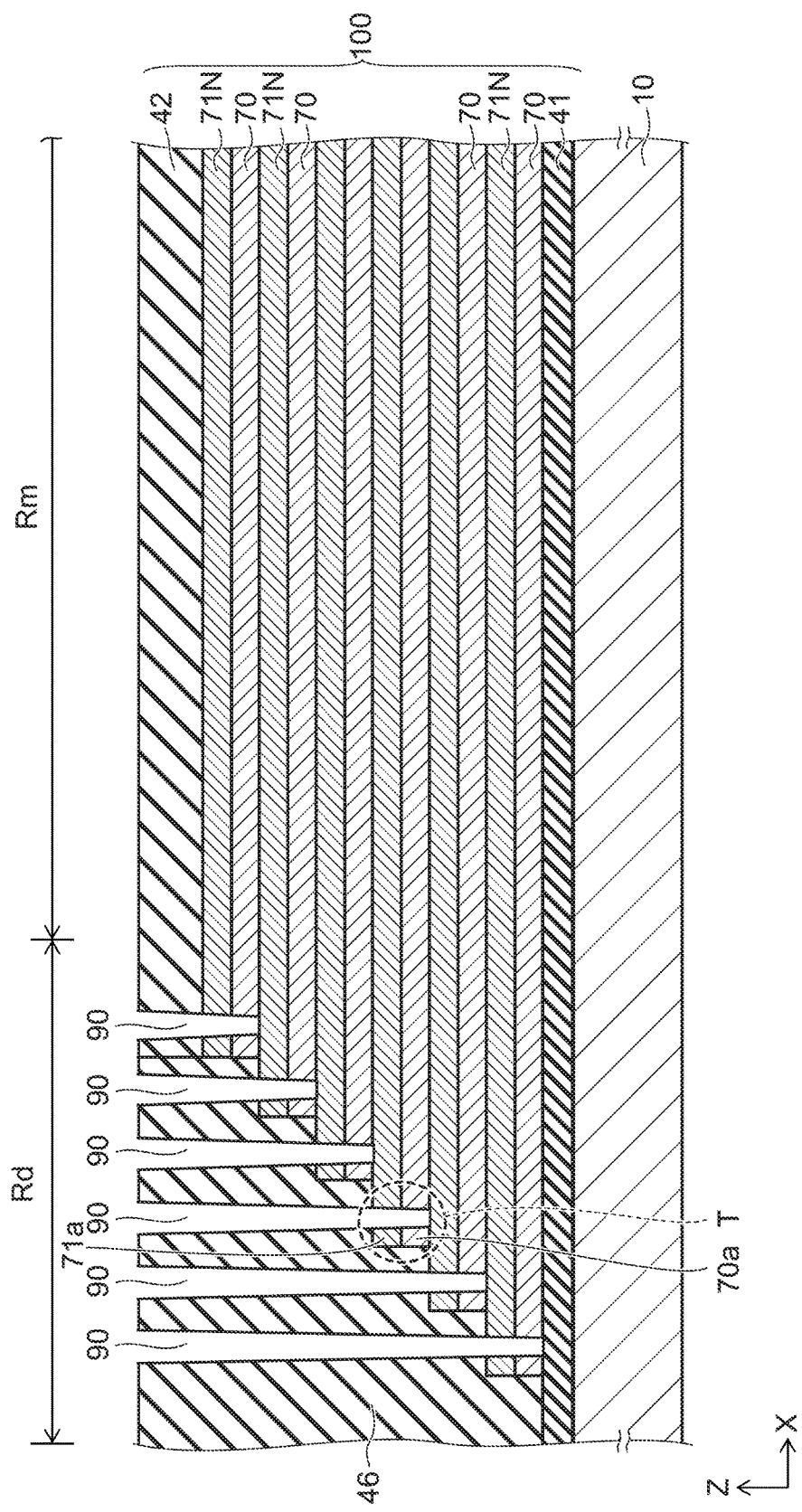

After removing the resist film 80, the insulating layer 46 shown in FIG. 20 is formed on the stairstep portion 2. A plurality of contact holes 90 extending in the Z-direction are made in the insulating layer 46. The contact hole 90 pierces the insulating layer 46, and the molybdenum layer 71a and the tungsten layer 70a of each terrace portion T, and reaches another molybdenum layer 71N under that terrace portion T. The contact hole 90 that pierces the insulating film 42, the uppermost molybdenum layer 71N, and the uppermost tungsten layer 70 is made in the uppermost level on the memory cell array region Rm side. For example, the contact holes 90 are made simultaneously by RIE using a not-shown mask.

In the process that makes the contact holes 90, one layer of the molybdenum layer 71N and one layer of the tungsten layer 70 of each level are etched using, for example, an etching gas containing fluorine similar to when forming the stairstep portion 2 described above.

At this time as well, the etching rate of the nitrogen-containing molybdenum layer 71N is slower than that of the tungsten layer 70. Accordingly, the molybdenum layer 71N under the terrace portion T functions as an etching stopper, and makes it easy to control the stopping of the etching of the tungsten layer 70a of the terrace portion T at another molybdenum layer 71N under that tungsten layer 70a. This prevents one contact hole 90 from piercing the plurality of tungsten layers 70.

Figure 21:
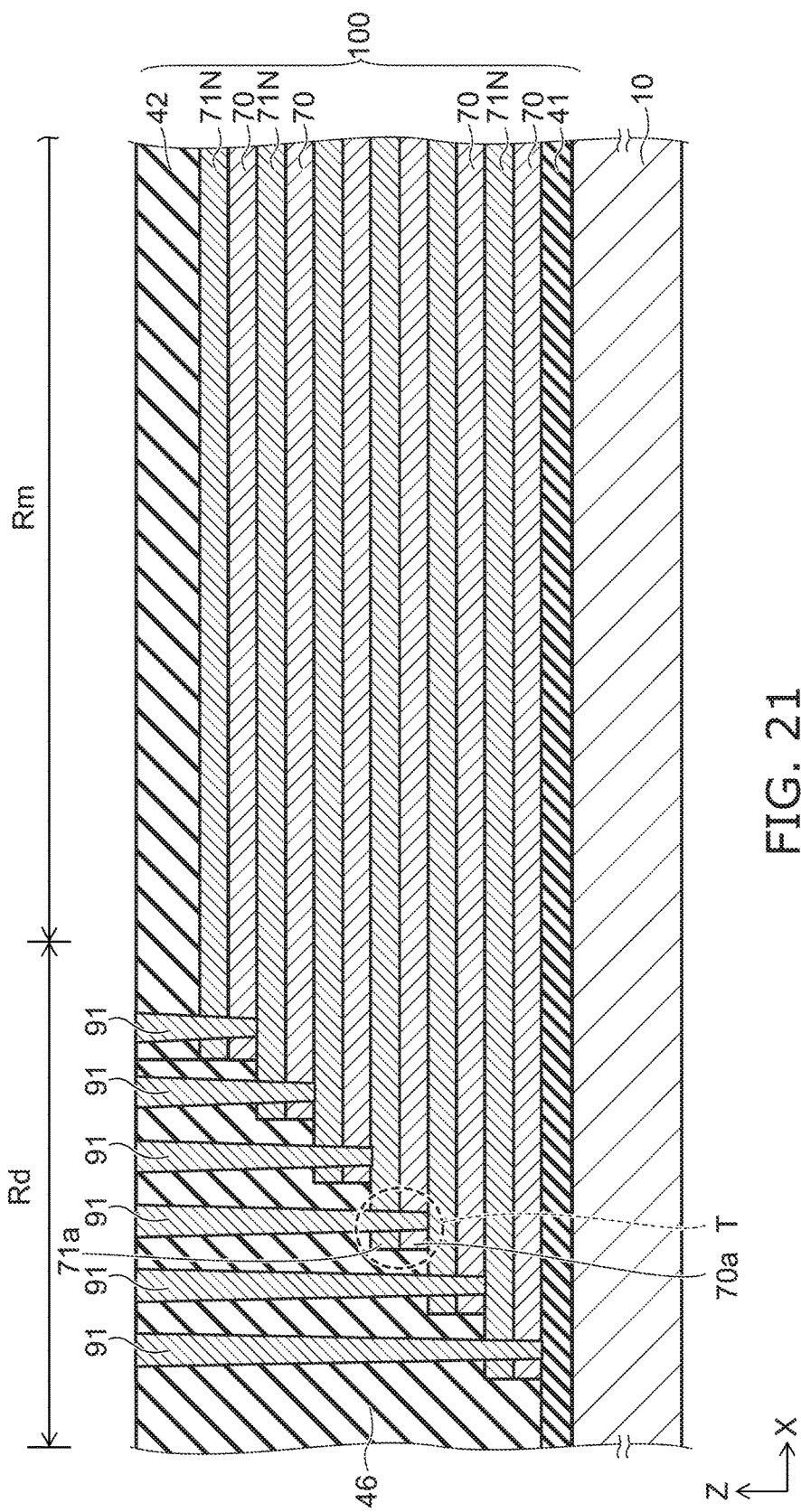
Figure 22:
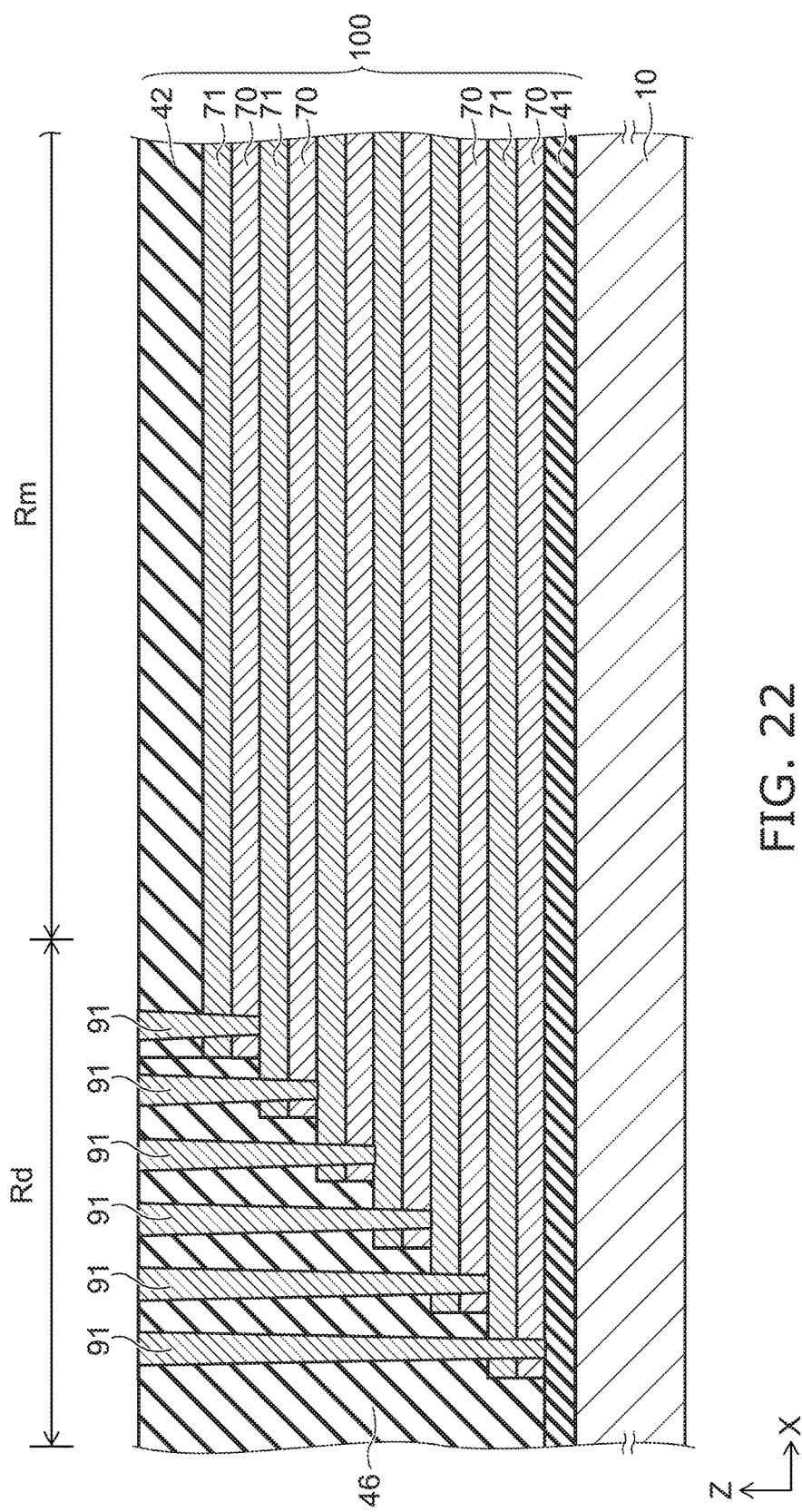

The contact 91 shown in FIG. 21 is formed by burying a conductive material inside the contact hole 90. The contact 91 pierces the stacked film of one layer of the molybdenum layers 71a and one layer of the tungsten layers 70a of each terrace portion T, and reaches another molybdenum layer 71N under the terrace portion T. The tungsten layer 70a of the terrace portion T contacts the side surface of the lower end portion of the contact 91.

After forming the contacts 91, heat treatment of the stacked body 100 is implemented. For example, the wafer that includes the components shown in FIG. 21 is heated for 5 minutes to 5 hours at 400 to 1000° C., and desirably 500° C. or more, in a non-oxidative and non-nitrative atmosphere (e.g., in an argon gas atmosphere at reduced pressure).

In the heat treatment, nitrogen desorbs from the nitrogen-containing molybdenum layer 71N, becomes nitrogen gas ($N_2$ gas), and is discharged into the atmosphere. The nitrogen concentration in the nitrogen-containing molybdenum layer 71N decreases drastically; and the nitrogen-containing molybdenum layer 71N becomes the molybdenum layer 71 shown in FIG. 22. The nitrogen contained in the molybdenum layer 71 is not completely gone; and a trace of nitrogen remains in the molybdenum layer 71 as well.

Also, in the heat treatment recited above, the nitrogen desorbed from the molybdenum layer 71N diffuses into the tungsten layer 70; and trace nitrogen is contained also in the tungsten layer 70. The nitrogen content of the tungsten layer 70 after the heat treatment is, for example, $1\times10^{21}/cm^3$ or less and is about $1\times10^{20}/cm^3$.

The molybdenum layer 71N prior to the heat treatment recited above contained a higher concentration of nitrogen than the tungsten layer 70 prior to the heat treatment and the molybdenum layer 71 after the heat treatment. The difference between the nitrogen concentrations (the nitrogen contents) of the tungsten layer 70 and the molybdenum layer 71 after the heat treatment is smaller than the difference between the nitrogen concentrations (the nitrogen contents) of the tungsten layer 70 and the molybdenum layer 71N prior to the heat treatment. For example, the difference of the nitrogen concentrations recited above corresponds to the difference of the etching rates when using an etching gas containing fluorine. By the desorption of the nitrogen, the molybdenum layer 71N is altered into a soft molybdenum layer 71; and, for example, the rate when etching using the gas containing fluorine increases.

The difference between the etching rate of the tungsten layers 70 and the etching rate of the molybdenum layers 71 after the heat treatment is smaller than the difference between the etching rate of the tungsten layers 70 and the etching rate of the molybdenum layers 71N prior to the heat treatment.

Figure 23:
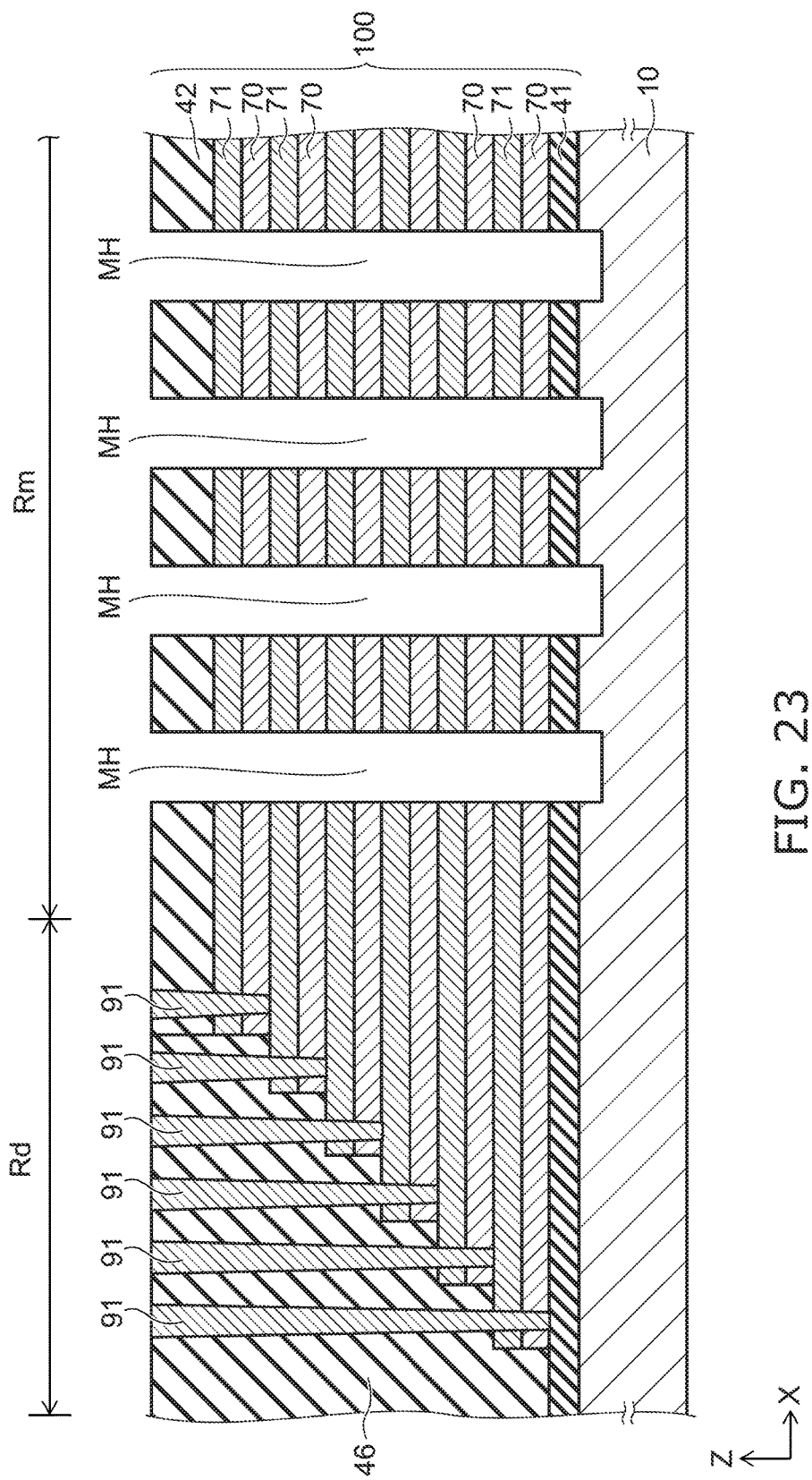

Under conditions in which the tungsten layers 70 and the molybdenum layers 71 are controlled using such etching conditions, the memory holes MH are made in the stacked body 100 in the memory cell array region Rm as shown in FIG. 23.

For example, the plurality of memory holes MH are made simultaneously by RIE using a not-shown mask. For example, an etching gas containing fluorine similar to that used when making the stairstep portion 2 and the contact holes 90 is used in the etching of the tungsten layers 70 and the molybdenum layers 71 at this time.

The molybdenum layers 71 and the tungsten layers 70 are etched using the same etching gas without switching the etching gas between the etching of the molybdenum layer 71 and the etching of the tungsten layer 70. This makes high-throughput processing possible.

If the etching rate difference between the tungsten layer 70 and the molybdenum layer 71 when making the memory holes MH is large, a side etching of the tungsten layer 70 or the molybdenum layer 71 may progress, and a difference in levels may be formed along the depth direction in the side surfaces of the memory holes MH. Such a side surface configuration of the memory holes MH may cause the degradation and fluctuation of the characteristics of the memory cells MC.

However, according to the embodiment, due to the nitrogen desorption from the nitrogen-containing molybdenum layer 71N due to the heat treatment recited above, the etching rate of the tungsten layer 70 and the etching rate of the molybdenum layer 71 is substantially the same or difference of these etching rates becomes smaller than when making the stairstep portion 2 and the contact holes 90. Therefore, it is possible to make the memory holes MH having straight side surface configurations.

Figure 24:
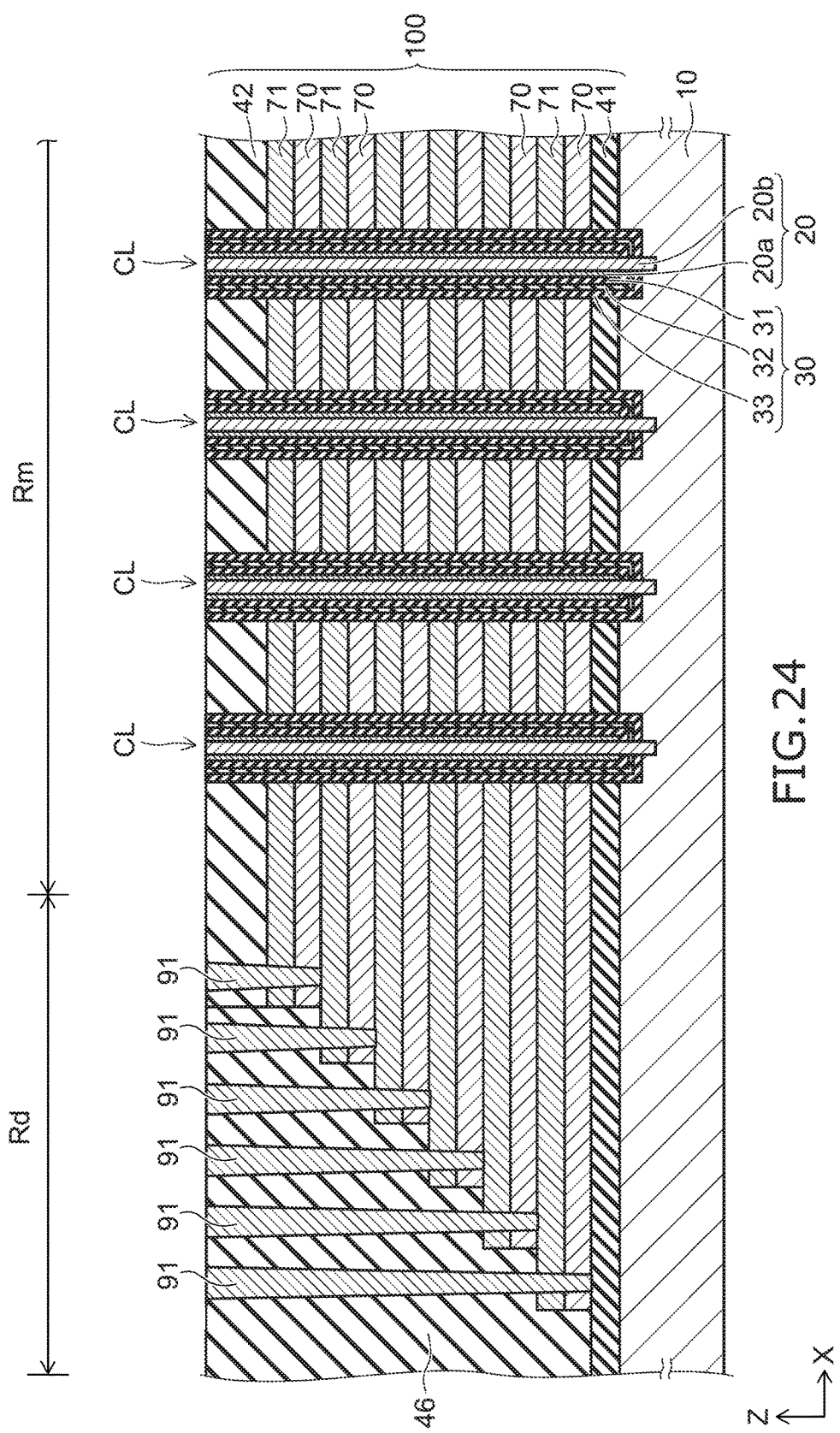

The columnar portions CL shown in FIG. 24 are formed inside the memory holes MH by processes similar to those of the first embodiment shown in FIG. 6 to FIG. 10.

Figure 25:
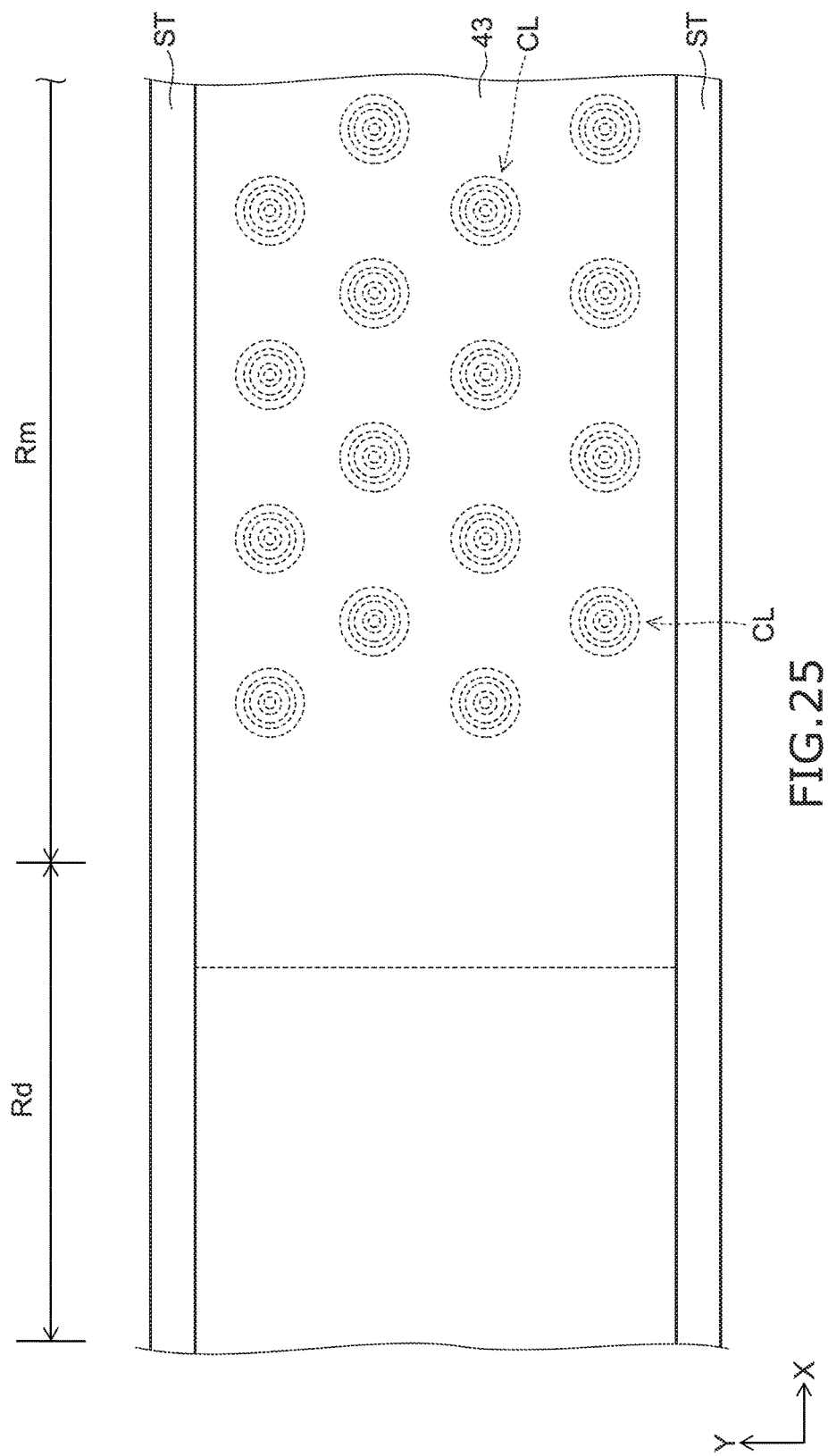

Subsequently, the slits ST are made in the stacked body 100 similarly to the first embodiment. As shown in FIG. 25, the slits ST extend in the X-direction through the memory cell array region Rm and the peripheral region Rd.

Similarly to when making the memory holes MH, for example, the tungsten layers 70 and the molybdenum layers 71 are etched by RIE using a gas containing fluorine.

Figure 26:
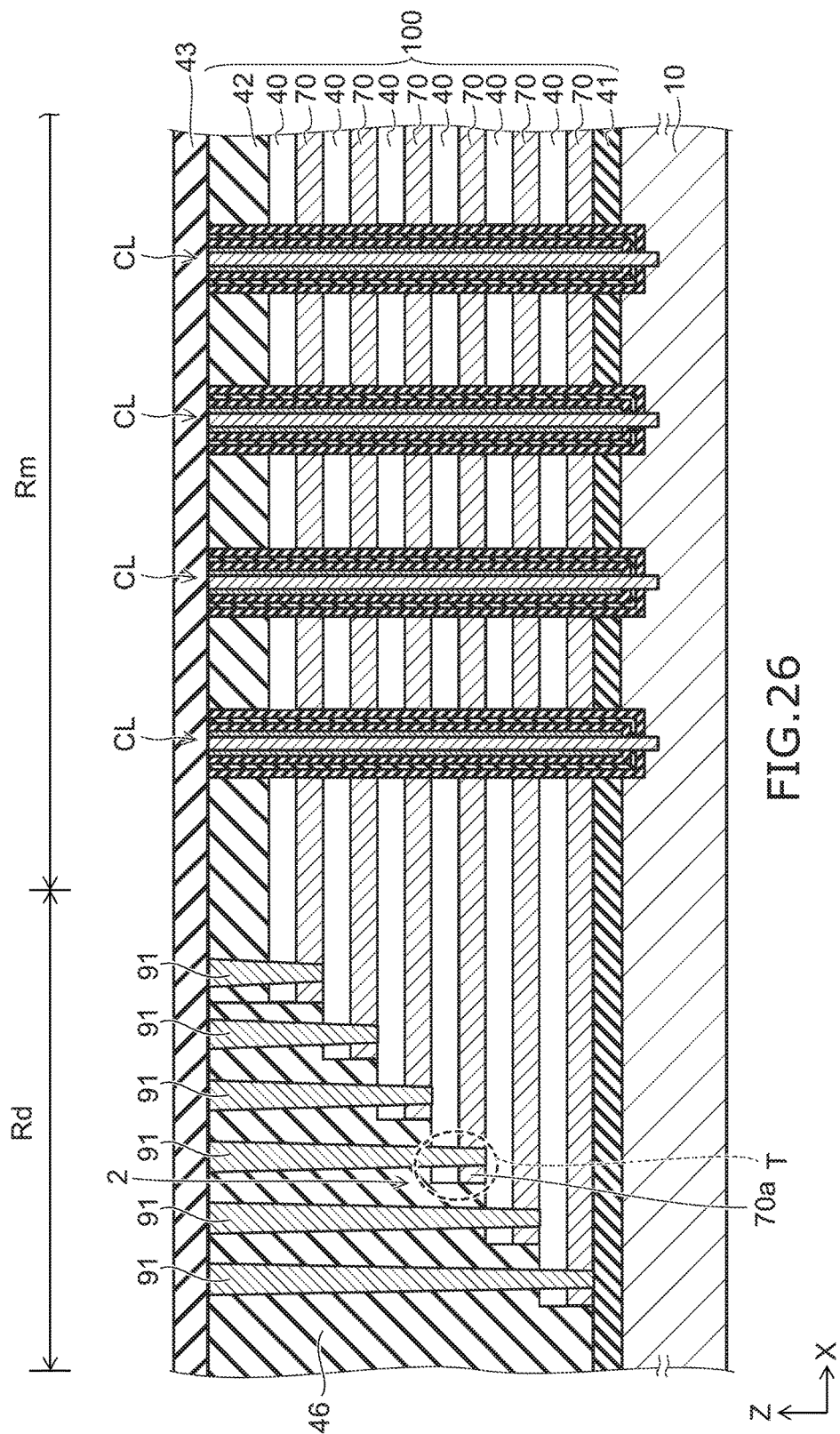

Then, similarly to the first embodiment, the molybdenum layers 71 are removed by etching through the slits ST. By the removal of the molybdenum layers 71, the air gap 40 is made between the tungsten layers 70 adjacent to each other above and below as shown in FIG. 26. Also, the air gap 40 is made also between the insulating film 42 and the uppermost tungsten layer 70.

The tungsten layers 70 that are stacked with the air gap 40 interposed are supported by the columnar portions CL; and the air gap 40 is maintained between the tungsten layers 70.

After making the air gap 40, the interconnect portions LI are formed, with the insulating film 63 shown in FIG. 16 interposed, inside the slits ST. Subsequently, the bit lines BL, the upper layer interconnect 92, etc., shown in FIG. 16 are formed.

In the second embodiment, the lower limit of the nitrogen concentration of the nitrogen-containing molybdenum layer 71N can be determined by the etching selectivity of the molybdenum layer 71N and the tungsten layer 70 determined in the etching that makes the stairstep portion 2 and the contact holes 90. The upper limit of the nitrogen concentration of the nitrogen-containing molybdenum layer 71N can be determined by the efficiency of the nitrogen desorption processing.

In the case where the molybdenum layer 71 does not contain nitrogen, the etching rate of the molybdenum layer 71 easily becomes higher than the etching rate of the tungsten layer 70 when etching using, for example, a gas containing fluorine. Therefore, when making the memory holes MH as shown in FIG. 27B, side etching of the side surfaces of the molybdenum layers 71 exposed in the memory holes MH may occur; the side surfaces of the molybdenum layers 71 may recede from the side surfaces of the tungsten layers 70; and a difference in levels may be formed along the depth direction in the side surfaces of the memory holes MH.

On the other hand, compared to the molybdenum layer 71 not containing nitrogen, the etching resistance of the molybdenum layer 71 that contains a trace amount of residual nitrogen when etching using, for example, a gas containing fluorine is high. Therefore, as shown in FIG. 27A, when making the memory holes MH, it is possible to set the etching rates of the tungsten layer 70 and the molybdenum layer 71 to be substantially equal; and it is possible to suppress the side etching of the side surface of the memory hole MH, and make the memory holes MH to have straight side surface configurations.

A test example will now be described.

FIG. 28 is a graph showing the nitrogen concentration distribution of a sample of the test example, where the horizontal axis is the depth, and the vertical axis is the nitrogen concentration. Also, a cross-sectional view of the sample used in the analysis is shown in FIG. 28 at a position matching the horizontal axis.

In the test example as shown in FIG. 28, the sample 150 is made in which a tungsten nitride film (a WN film) 152 is formed on a silicon substrate 151; and a tungsten film (a W film) 153 is formed on the tungsten nitride film (the WN film) 152.

Then, heat treatment having conditions similar to those of the second embodiment described above is performed on the sample 150; and the nitrogen inside the tungsten nitride film 152 is caused to desorb. Some of the nitrogen desorbed from the tungsten nitride film 152 diffuses into the tungsten film 153.

Subsequently, the nitrogen inside the sample 150 was detected by analyzing the sample 150 by a secondary ionization mass spectrometer (SIMS) from the tungsten film 153 side. As a result, nitrogen of about $1 \times 10^{20}$ to $2 \times 10^{20}/cm^3$ was contained in the tungsten film 153. Accordingly, it is inferred that the nitrogen concentration of the tungsten layer 70 of the semiconductor device of the second embodiment is about the same.

When forming the stairstep portion 2 and when making the contact holes 90, it is sufficient to have a nitrogen-containing molybdenum region at the interface between the tungsten layer 70 that is etched, and the molybdenum layer 71N under the tungsten layer 70 to reliably stop the etching at the interface. Accordingly, it is sufficient for the molybdenum layer 71N to contain nitrogen in at least the surface layer portion of the molybdenum layer 71N on the side of the interface with the tungsten layer 70 on the molybdenum layer 71N.

For example, nitrogen is caused to adsorb to the upper surface of the molybdenum layer by forming a molybdenum layer not containing nitrogen and subsequently supplying a gas containing nitrogen to the upper surface of the molybdenum layer. Or, when forming the molybdenum layer by CVD, a gas containing nitrogen is introduced to the chamber directly before the end of the film formation. Or, when forming the molybdenum layer by sputtering using a molybdenum target, a gas containing nitrogen is introduced to the chamber directly before the end of the film formation. The tungsten layer is stacked on the upper surface of such a molybdenum layer having the adsorbed nitrogen.

Or, after forming the molybdenum layer, for example, a gas containing $SiH_4$ and $B_2H_6$ is supplied to the upper surface of the molybdenum layer; and nitriding may be performed after causing silicon to adsorb to the upper surface of the molybdenum layer. A silicon nitride film is formed on the upper surface of the molybdenum layer (the interface with the tungsten layer) by such processing. The silicon nitride film also can function as the etching stopper when forming the stairstep portion 2 and when making the contact holes 90.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    a stacked body including a plurality of tungsten layers and a plurality of alloy layers of tungsten and molybdenum, at least portions of the tungsten layers being stacked with an air gap interposed, the alloy layers being provided on surfaces of the tungsten layers opposing the air gap;
    a semiconductor body extending in a stacking direction through the stacked body; and
    a stacked film provided between the semiconductor body and the tungsten layers, the stacked film including a charge storage portion.

2. The semiconductor device according to claim 1, wherein the alloy layers are thinner than the tungsten layers.

3. The semiconductor device according to claim 1, wherein molybdenum atoms are contained in crystal grain boundaries of the tungsten layers.

4. The semiconductor device according to claim 1, wherein
    the tungsten layers are stacked above a major surface of a substrate in a direction perpendicular to the major surface, and
    a lower end of the semiconductor body extending in the stacking direction contacts the substrate.

5. The semiconductor device according to claim 4, further comprising an interconnect portion extending in the stacking direction through the stacked body and having a lower end contacting the substrate.

6. The semiconductor device according to claim 4, further comprising an insulating film provided between the substrate and a lowermost tungsten layer of the tungsten layers.

* * * * *